(12) United States Patent
Kobayashi et al.

(10) Patent No.: US 9,401,432 B2
(45) Date of Patent: Jul. 26, 2016

(54) SEMICONDUCTOR DEVICE AND ELECTRONIC DEVICE

(71) Applicant: SEMICONDUCTOR ENERGY LABORATORY CO., LTD., Atsugi-shi, Kanagawa-ken (JP)

(72) Inventors: Yoshiyuki Kobayashi, Kanagawa (JP); Daisuke Matsubayashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/593,227

(22) Filed: Jan. 9, 2015

(65) Prior Publication Data

US 2015/0200305 A1 Jul. 16, 2015

(30) Foreign Application Priority Data

Jan. 16, 2014 (JP) ................. 2014-005618

(51) Int. Cl.
*H01L 29/12* (2006.01)
*H01L 29/786* (2006.01)
*H01L 27/12* (2006.01)

(52) U.S. Cl.
CPC ........ *H01L 29/7869* (2013.01); *H01L 27/1225* (2013.01)

(58) Field of Classification Search
CPC ................. H01L 27/1225; H01L 29/7869
USPC .......... 257/43, 57, 59, 60, 66, 67, 69, 70, 72, 257/347
See application file for complete search history.

(56) References Cited

U.S. PATENT DOCUMENTS

| 4,525,436 | A | * | 6/1985 | Yamazaki | ............... H01G 9/20 136/258 |
| 5,365,080 | A | * | 11/1994 | Yamazaki | ......... H01L 29/66757 257/66 |
| 5,528,032 | A | | 6/1996 | Uchiyama | |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Ori Nadav
(74) *Attorney, Agent, or Firm* — Nixon Peabody LLP; Jeffrey L. Costellia

(57) ABSTRACT

A semiconductor device of one embodiment of the present invention includes a semiconductor, an insulator, a first conductor, and a second conductor. In the semiconductor device, a top surface of the semiconductor has a region in contact with the insulator; a side surface of the semiconductor has a region in contact with the insulator; the first conductor has a first region overlapping with the semiconductor with the insulator positioned therebetween; the first region has a region in contact with the top surface of the semiconductor and a region in contact with the side surface of the semiconductor; the second conductor has a second region in contact with the semiconductor; and the first region and the second region do not overlap with each other.

19 Claims, 32 Drawing Sheets

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,821,559 A * | 10/1998 | Yamazaki | H01L 29/78675 257/347 |
| 6,225,196 B1 * | 5/2001 | Yokoyama | H01L 29/1604 257/E21.403 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,907,224 B2 * | 3/2011 | Ito | H01L 27/1225 349/106 |
| 8,436,431 B2 | 5/2013 | Takemura | |
| 8,547,771 B2 | 10/2013 | Koyama | |
| 8,890,159 B2 | 11/2014 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0001493 A1 * | 1/2003 | Park | G09G 3/3225 313/504 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0269639 A1 * | 12/2005 | Yamazaki | G02F 1/13454 257/350 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0240991 A1 | 10/2011 | Yamazaki | |
| 2014/0306217 A1 | 10/2014 | Yamazaki et al. | |
| 2014/0339538 A1 | 11/2014 | Yamazaki et al. | |
| 2014/0339544 A1 | 11/2014 | Hanaoka et al. | |
| 2014/0339548 A1 | 11/2014 | Yamazaki et al. | |
| 2014/0361293 A1 | 12/2014 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-045159 | 2/2010 |
| JP | 2011-022507 | 2/2011 |
| JP | 2011-181918 | 9/2011 |
| JP | 2012-059860 | 3/2012 |
| JP | 2012-257187 | 12/2012 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:AL and SN-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT ", AM-FPD '09 SID Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

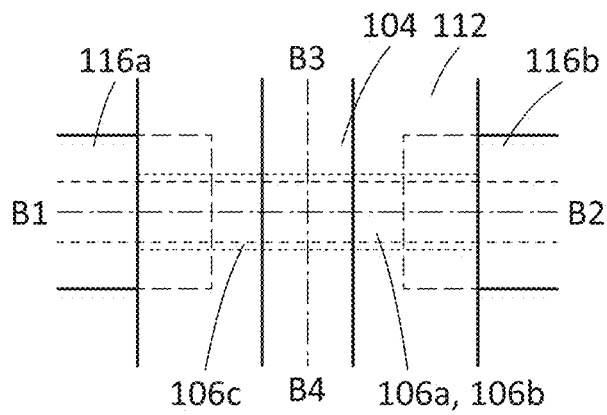
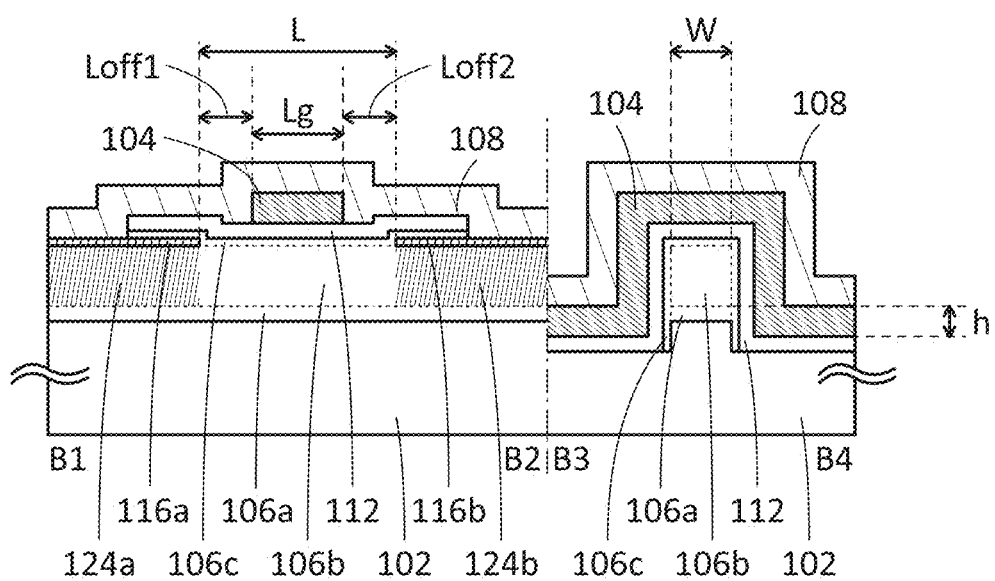

FIG. 26A1 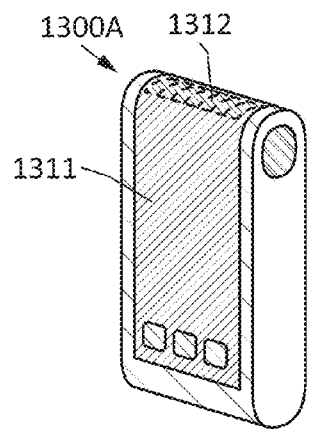
FIG. 26A2 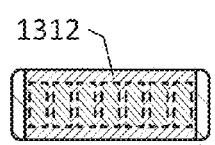
FIG. 26A3 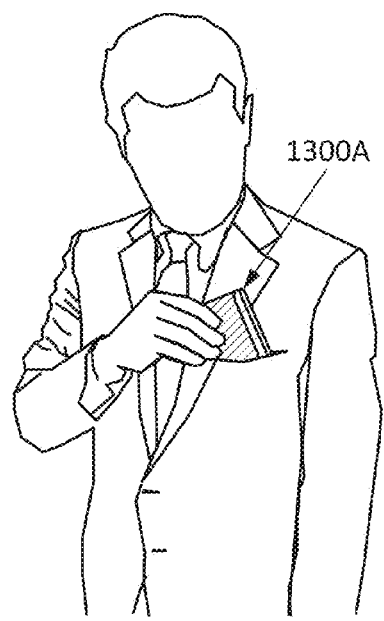
FIG. 26B1 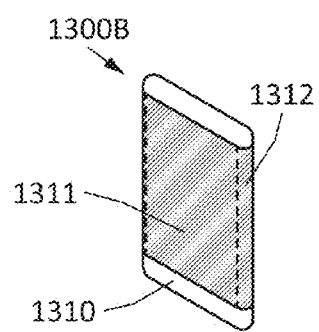
FIG. 26B2 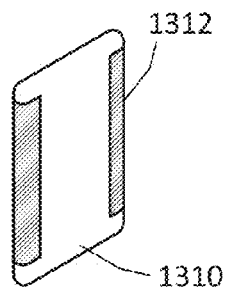
FIG. 26C1 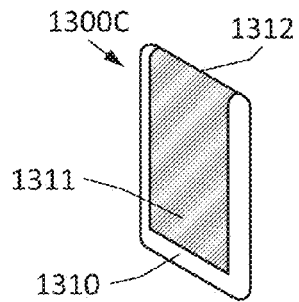
FIG. 26C2 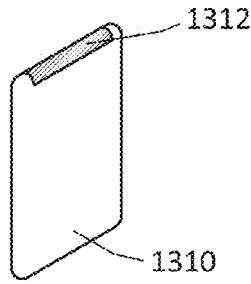

FIG. 28A
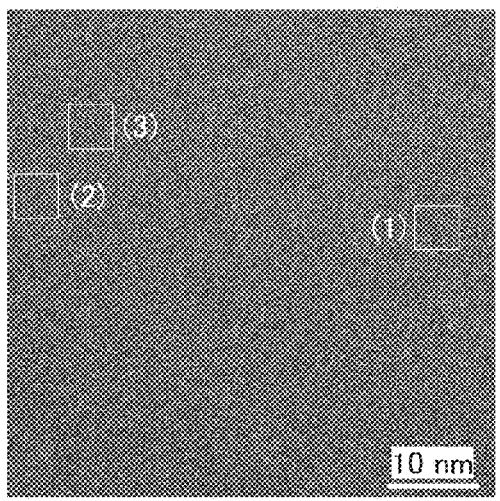
FIG. 28B       FIG. 28C       FIG. 28D
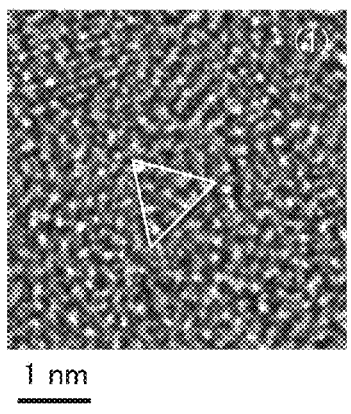 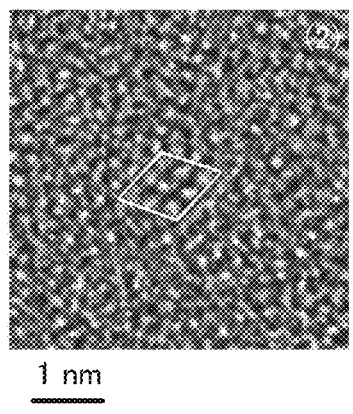 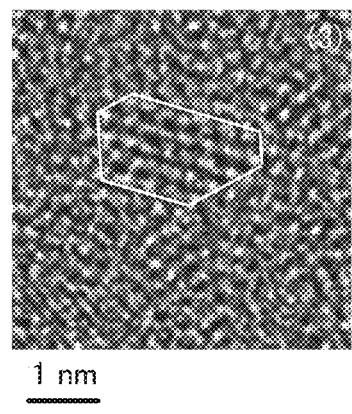

result from substrate

SEMICONDUCTOR DEVICE AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. In particular, the present invention relates to, for example, a semiconductor, a semiconductor device, a display device, a light-emitting device, a lighting device, a power storage device, a memory device, or a processor. Furthermore, the present invention relates to a manufacturing method of a semiconductor, a semiconductor device, a display device, a light-emitting device, a lighting device, a power storage device, a memory device, or a processor. The present invention relates to a driving method of a semiconductor device, a display device, a light-emitting device, a lighting device, a power storage device, a memory device, or a processor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

Attention has been focused on a technique for forming a transistor using a semiconductor over a substrate having an insulating surface. The transistor is applied to a wide range of semiconductor devices such as an integrated circuit and a display device. Silicon is known as a semiconductor applicable to a transistor.

As silicon used as a semiconductor of a transistor, any of amorphous silicon, polycrystalline silicon, single crystal silicon, and the like is used depending on the purpose. For example, in the case of a transistor included in a large display device, it is preferable to use amorphous silicon, which can be used to form a film on a large substrate with the established technique. On the other hand, in the case of a transistor included in a high-performance display device where a driver circuit and a pixel circuit are formed over the same substrate, it is preferable to use polycrystalline silicon, which can be used to form a transistor having a high field-effect mobility. Furthermore, in the case of a transistor included in an integrated circuit or the like, it is preferable to use single crystal silicon which provides a much higher field-effect mobility. As a method for forming a film using polycrystalline silicon, high-temperature heat treatment or laser light treatment that is performed on amorphous silicon has been known.

In recent years, an oxide semiconductor has attracted attention. An oxide semiconductor can be formed by a sputtering method or the like, and thus can be used for a semiconductor of a transistor included in a large display device. Furthermore, a transistor including an oxide semiconductor has a high field-effect mobility; therefore, a high-performance display device where a driver circuit and a pixel circuit are formed over the same substrate can be obtained. In addition, there is an advantage that capital investment can be reduced because part of production equipment for a transistor including amorphous silicon can be retrofitted and utilized.

A transistor including an oxide semiconductor is known to have extremely small leakage current in an off state. For example, a low power consumption CPU and the like utilizing the feature of small leakage current of the transistor including an oxide semiconductor are disclosed (see Patent Document 1). In the case where transistors each including an oxide semiconductor are used in an integrated circuit such as a CPU, the transistors are preferably decreased in size to be integrated.

When the degree of integration is increased in a semiconductor device, parasitic capacitance formed by overlap between wirings, electrodes, and the like might have a non-negligible effect. According to Patent Document 2, even with an offset region, a disclosed transistor achieves excellent electrical characteristics by electron injection from a conductor electrode to a semiconductor. By the technique disclosed in Patent Document 2, the parasitic capacitance formed by overlap between wirings, electrodes, and the like can be reduced.

It is also disclosed that a transistor having a high field-effect mobility can be obtained by a well potential formed using an active layer including a semiconductor (see Patent Document 3).

REFERENCE

Patent Document

[Patent Document 1] Japanese Published Patent Application No. 2012-257187
[Patent Document 2] Japanese Published Patent Application No. 2011-22507
[Patent Document 3] Japanese Published Patent Application No. 2012-59860

SUMMARY OF THE INVENTION

An object is to provide a transistor with excellent electrical characteristics. Another object is to provide a transistor having low off-state current (current in an off state). Another object is to provide a transistor having a high on-state current (current in an on state). Another object is to provide a semiconductor device including the transistor. Another object is to provide a highly integrated semiconductor device. Another object is to provide a durable semiconductor device. Another object is to provide a novel semiconductor device.

Note that the descriptions of these objects do not disturb the existence of other objects. In one embodiment of the present invention, there is no need to achieve all the objects. Other objects will be apparent from and can be derived from the descriptions of the specification, the drawings, the claims, and the like.

(1) One embodiment of the present invention is a semiconductor device including a semiconductor, an insulator, a first conductor, and a second conductor. In the semiconductor device, a top surface of the semiconductor has a region in contact with the insulator; a side surface of the semiconductor has a region in contact with the insulator; the first conductor has a first region overlapping with the semiconductor with the insulator positioned therebetween; the first region has a region in contact with the top surface of the semiconductor and a region in contact with the side surface of the semiconductor; the second conductor has a second region in contact with the semiconductor; and the first region and the second region do not overlap with each other.

(2) Another embodiment of the present invention is a semiconductor device including a semiconductor, an insulator, a first conductor, a second conductor, and a third conductor. In the semiconductor device, a top surface of the semiconductor has a region in contact with the insulator; a side surface of the semiconductor has a region in contact with the insulator; the first conductor has a first region overlapping with the semiconductor with the insulator positioned therebetween; the first region has a region in contact with the top surface of the semiconductor and a region in contact with the side surface of the semiconductor; the second conductor has a second region in contact with the semiconductor; the third conductor has a third region in contact with the semiconductor; the second region and the third region have an overlapped region; and the first region and the second region do not overlap with each other.

(3) Another embodiment of the present invention is a semiconductor device including a semiconductor, a first insulator, a second insulator, a first conductor, and a second conductor. In the semiconductor device, the semiconductor has a region in contact with the first insulator and a first region where the first conductor and the second conductor do not overlap with each other; the first conductor has a second region overlapping with the semiconductor with the first insulator positioned therebetween; the second conductor has a third region in contact with the semiconductor; and the second insulator has a region in contact with the first region.

(4) Another embodiment of the present invention is the semiconductor device described in (3), in which the second insulator has a higher relative permittivity than the first insulator.

(5) Another embodiment of the present invention is the semiconductor device described in any one of (1) to (4), in which the distance between the first conductor on the semiconductor and the second conductor on the semiconductor is less than or equal to 30 nm.

(6) Another embodiment of the present invention is the semiconductor device described in any one of (1) to (5), in which the semiconductor includes a first layer and a second layer, and an electron affinity of the first layer is different from an electron affinity of the second layer.

(7) Another embodiment of the present invention is the semiconductor device described in any one of (1) to (6), in which the semiconductor contains indium and oxygen.

(8) Another embodiment of the present invention is an electronic device including a display device, a battery or a sensor, and the semiconductor device described in any one of claims (1) to (7).

A transistor having excellent electrical characteristics can be provided. A transistor having low off-state current can be provided. A transistor having a high on-state current can be provided. A semiconductor device including the transistor can be provided. A highly integrated semiconductor device can be provided. A durable semiconductor device can be provided. A novel semiconductor device can be provided.

Note that the descriptions of these effects does not disturb the existence of other effects. One embodiment of the present invention does not necessarily achieve all the objects listed above. Other effects will be apparent from and can be derived from the descriptions of the specification, the drawings, the claims, and the like.

BRIEF DESCRIPTION OF THE DRAWINGS

FIGS. 2A and 2B are a top view and a cross-sectional view illustrating a transistor of one embodiment of the present invention.

FIGS. 26A1, 26A2, 26A3, 26B1, 26B2, 26C1, and 26C2 illustrate electronic devices of embodiments of the present invention.

FIGS. 28A to 28D are Cs-corrected high-resolution TEM images of a plane of a CAAC-OS.

DETAILED DESCRIPTION OF THE INVENTION

Figure 1A:
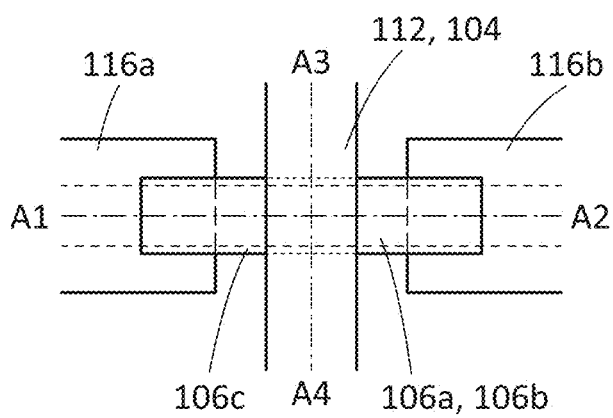
FIGS. 1A and 1B are a top view and a cross-sectional view illustrating a transistor of one embodiment of the present invention.

Embodiments of the present invention will be described in detail with reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams may be exaggerated for clarity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for the sake of convenience and do not denote the order of steps or the stacking order of layers. Therefore, for example, the term "first" can be replaced with the term "second", "third", or the like as appropriate. In addition, the ordinal numbers in this specification and the like are not necessarily the same as the ordinal numbers used to specify one embodiment of the present invention.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In embodiments described below, the case where the semiconductor is an oxide semiconductor is described; however, one embodiment of the present invention is not limited thereto. For example, as the semiconductor, silicon, germanium, or the like which has a polycrystalline structure, a single crystal structure, or the like may be used. Alternatively, a semiconductor having distortion such as distorted silicon may be used. Alternatively, as the semiconductor, gallium arsenide, aluminum gallium arsenide, indium gallium arsenide, gallium nitride, indium phosphide, silicon germanium, or the like which can be used for a high-electron-mobility transistor (HEMT) may be used. By using any of these semiconductors, a transistor capable of high speed operation can be obtained.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

<Relationship Between Transistor Structure and Electrical Characteristics>

The calculation results of the relationship between a transistor structure and electrical characteristics will be described below with reference to FIGS. 1A and 1B, FIGS. 2A and 2B, FIGS. 3A and 3B, FIG. 4, FIG. 5, and FIG. 6.

Figure 1B:
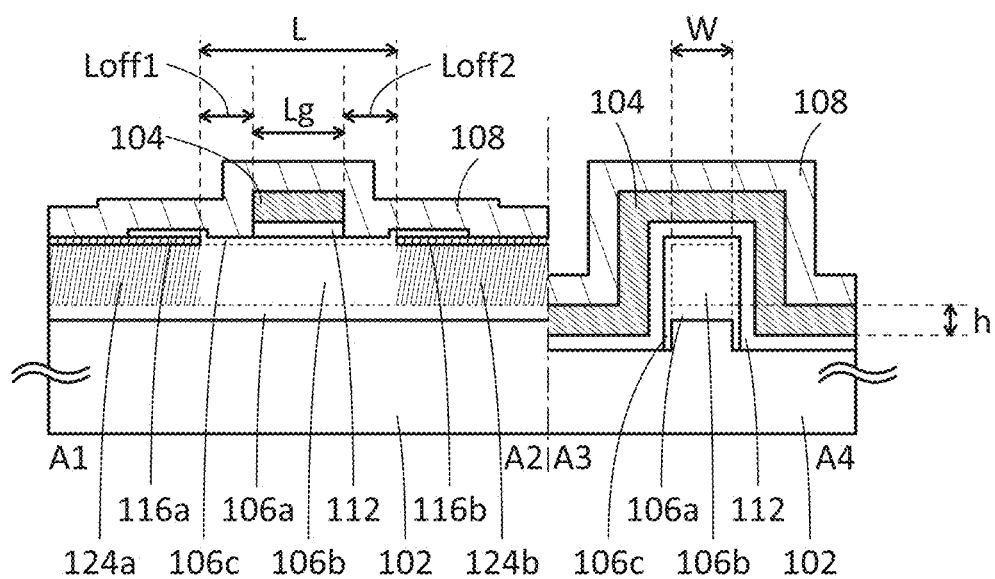

FIG. 1A is an example of a top view of a transistor structure A of one embodiment of the present invention. FIG. 1B is a cross-sectional view taken along the dashed-dotted line A1-A2 and the dashed-dotted line A3-A4 in FIG. 1A. Note that some components such as an insulator are omitted in FIG. 1A for easy understanding.

The transistor structure A illustrated in FIG. 1B includes an insulator 102; a semiconductor 106a over the insulator 102; a semiconductor 106b over the semiconductor 106a; a conductor 116a and a conductor 116b each having a region in contact with the semiconductor 106b; a semiconductor 106c being over the conductors 116a and 116b and the semiconductor 106b and having a region in contact with a top and side surfaces of the semiconductor 106b and a side surface of the semiconductor 106a; an insulator 112 over the insulator 102 and the semiconductor 106c; a conductor 104 being over the insulator 112 and having a region overlapping with the semiconductor 106a, the semiconductor 106b, and the semiconductor 106c; and an insulator 108 over the insulator 102, the conductor 116a, the conductor 116b, the semiconductor 106c, and the conductor 104. Note that the semiconductor 106b has a region 124a overlapping with the conductor 116a, and a region 124b overlapping with the conductor 116b. Note that in this specification, semiconductors, insulators, and conductors are also referred to as semiconductor layers, insulating layers, and conductive layers, respectively.

In the transistor structure A, the insulator 102 functions as a base insulator; the insulator 112 functions as a gate insulator; the conductor 104 functions as a gate electrode; the conductors 116a and 116b each function as a source electrode or a drain electrode; the regions 124a and 124b each function as a source region or a drain region; part of the semiconductor 106b functions as a channel formation region; and the semiconductors 106a and 106c separate a channel formation region in the semiconductor 106b from the insulators 102 and 112.

In the transistor structure A, a width of the conductor 104 in the A1-A2 cross section is referred to as Lg, and a region or an interval between the region 124a and the region 124b is referred to as L. A region or an interval between the conductor 104 and the region 124a in the A1-A2 cross section is referred to as Loff1, and a region or an interval between the conductor 104 and the region 124b is referred to as Loff2. A width of the semiconductor 106b in the A3-A4 cross section is referred to as W. A height of the conductor 104 (a distance from its lowermost surface to a bottom surface of the semiconductor 106b) in the A3-A4 cross section is referred to as h. In the semiconductor 106b, when only a region overlapping with the conductor 104 is used as a channel formation region, Loff1 and Loff2 are offset regions.

FIG. 2A is an example of a top view of a transistor structure B of one embodiment of the present invention. FIG. 2B is a cross-sectional view taken along the dashed-dotted line B1-B2 and the dashed-dotted line B3-B4 in FIG. 2A. Note that some components such as an insulator are omitted in FIG. 2A for easy understanding.

The transistor structure B includes an insulator 102; a semiconductor 106a over the insulator 102; a semiconductor 106b over the semiconductor 106a; a conductor 116a and a conductor 116b each having a region in contact with the semiconductor 106b; a semiconductor 106c being over the conductors 116a and 116b and the semiconductor 106b and having a region in contact with a top and side surfaces of the semiconductor 106b and a side surface of the semiconductor 106a; an insulator 112 over the insulator 102, the semiconductor 106c, the conductor 116a, and the conductor 116b; a conductor 104 being over the insulator 112 and having a region overlapping with the semiconductor 106a, the semiconductor 106b, and the semiconductor 106c; and an insulator 108 over the insulator 102, the conductor 116a, the conductor 116b, and the conductor 104. Note that the semiconductor 106b has a region 124a overlapping with the conductor 116a, and a region 124b overlapping with the conductor 116b.

In the transistor structure B, the insulator 102 functions as a base insulator; the insulator 112 functions as a gate insulator; the conductor 104 functions as a gate electrode; the conductors 116a and 116b each function as a source electrode or a drain electrode; the regions 124a and 124b each function as a source region or a drain region; part of the semiconductor 106b functions as a channel formation region; and the semiconductors 106a and 106c separate a channel formation region in the semiconductor 106b from the insulators 102 and 112.

In the transistor structure B, a width of the conductor 104 in the B1-B2 cross section is referred to as Lg, and an interval between the region 124a and the region 124b is referred to as L. A region or an interval between the conductor 104 and the region 124a in the B1-B2 cross section is referred to as Loff1, and a region or an interval between the conductor 104 and the region 124b is referred to as Loff2. A width of the semiconductor 106b in the B3-B4 cross section is referred to as W. A height of the conductor 104 (a distance from its lowermost surface to a bottom surface of the semiconductor 106b) in the B3-B4 cross section is referred to as h. In the semiconductor 106b, when only a region overlapping with the conductor 104 is used as a channel formation region, Loff1 and Loff2 are offset regions.

Therefore, the shape of the insulator 112 in the transistor structure B is different from that in the transistor structure A.

Figure 3A:
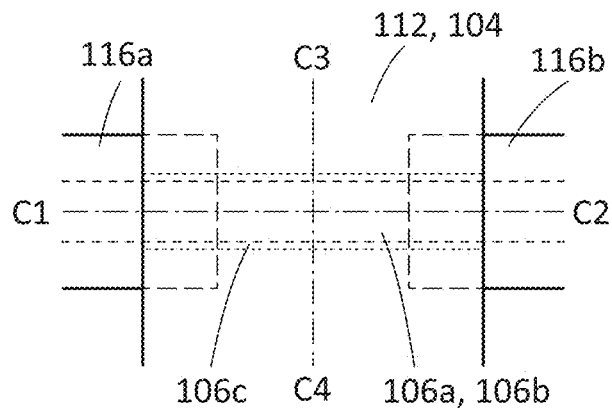
FIGS. 3A and 3B are a top view and a cross-sectional view illustrating a transistor of one embodiment of the present invention.
Figure 3B:
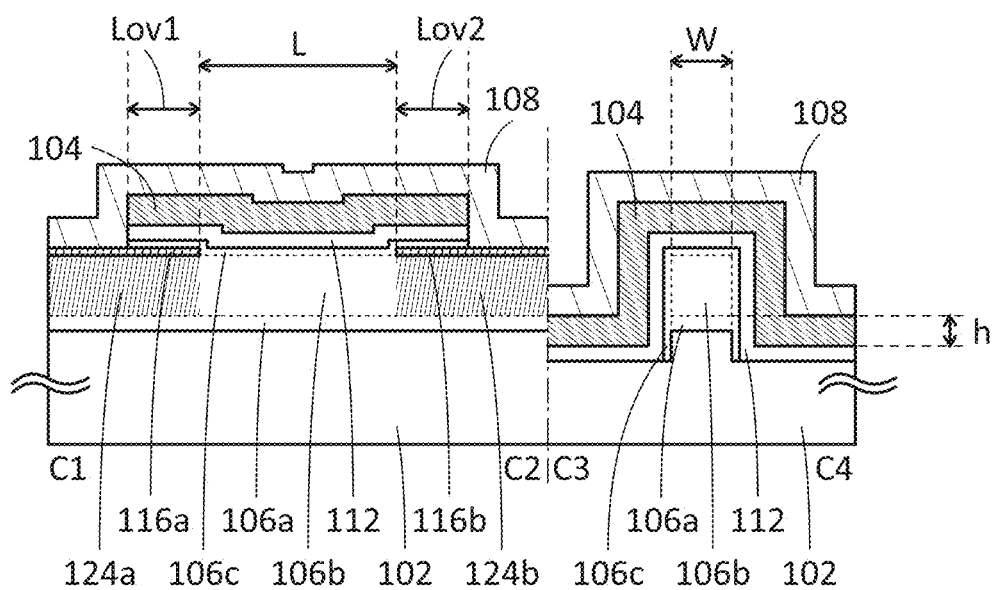

FIG. 3A is an example of a top view of a transistor structure C of one embodiment of the present invention. FIG. 3B is a cross-sectional view taken along the dashed-dotted line C1-C2 and the dashed-dotted line C3-C4 in FIG. 3A. Note that some components such as an insulator are omitted in FIG. 3A for easy understanding.

The transistor structure C includes an insulator 102; a semiconductor 106a over the insulator 102; a semiconductor 106b over the semiconductor 106a; a conductor 116a and a conductor 116b each having a region in contact with the semiconductor 106b; a semiconductor 106c being over the conductors 116a and 116b and the semiconductor 106b and having a region in contact with a top and side surfaces of the semiconductor 106b and a side surface of the semiconductor 106a; an insulator 112 over the insulator 102, the semiconductor 106c, the conductor 116a, and the conductor 116b; a conductor 104 being over the insulator 112 and having a region overlapping with the semiconductor 106a, the semiconductor 106b, the semiconductor 106c, the conductor 116a, and the conductor 116b; and an insulator 108 over the insulator 102, the conductor 116a, the conductor 116b, and the conductor 104. Note that the semiconductor 106b has a region 124a overlapping with the conductor 116a, and a region 124b overlapping with the conductor 116b.

In the transistor structure C, the insulator 102 functions as a base insulator; the insulator 112 functions as a gate insulator; the conductor 104 functions as a gate electrode; the conductors 116a and 116b each function as a source electrode or a drain electrode; the regions 124a and 124b each function as a source region or a drain region; part of the semiconductor 106b functions as a channel formation region; and the semiconductors 106a and 106c separate a channel formation region in the semiconductor 106b from the insulators 102 and 112.

In the transistor structure C, an interval between the region 124a and the region 124b in the C1-C2 cross section is referred to as L. A region or an interval where the conductor 104 and the region 124a overlap with each other in the C1-C2 cross section is referred to as Lov1, and a region or an interval where the conductor 104 and the region 124b overlap with each other is referred to as Lov2. A width of the semiconductor 106b in the C3-C4 cross section is referred to as W. A height of the conductor 104 (a distance from its lowermost surface to a bottom surface of the semiconductor 106b) in the C3-C4 cross section is referred to as h. In the semiconductor 106b, when a region which overlaps with the conductor 104 and positioned between the regions 124a and 124b is used as a channel formation region, Lov1 and Lov2 are overlap regions.

Therefore, the shape of the conductor 104 in the transistor structure C is different from that in the transistor structures A and B. Specifically, the transistor structure A and the transistor structure B do not have a region where the conductors 116a and 116b overlap with the conductor 104, whereas the transistor structure C has the region where the conductors 116a and 116b overlap with the conductor 104.

The structure having an offset region (the transistor structure A and the transistor structure B) probably has a smaller on-state current (also referred to as $I_{on}$) than a structure having the overlap region (the transistor structure C). This is because the offset region serves as on-state resistance of a transistor. The structure having the overlap region has a larger parasitic capacitance than the structure having the offset region. Note that the on-state current refers to a current that flows between a source and a drain when voltage larger than or equal to the threshold voltage is applied to a gate electrode of a transistor.

Next, differences in electrical characteristics between the transistor structures A, B, and C depending on L are evaluated by calculation. For the calculation, a three-dimensional structure is employed with the use of Sentaurus Device manufactured by Synopsys, Inc.

The following table shows conditions used for the calculation.

TABLE 1

| | | | |
|---|---|---|---|
| Insulator 108 | Relative permittivity | 8 | |
| | Thickness | 20 | nm |
| Conductor 104 | Work function | 5 | eV |
| Insulator 112 | Relative permittivity | 4.1 | |
| | Thickness | 10 | nm |
| Semiconductor 106c | Electron affinity | 4.3 | eV |
| | Eg | 3.7 | eV |
| | Relative permittivity | 15 | |
| | Donor density | 6.60E-09 | cm$^{-3}$ |
| | Electron mobility | 0.1 | cm$^2$/Vs |
| | Hole mobility | 0.01 | cm$^2$/Vs |
| | Nc | 5.00E+18 | cm$^{-3}$ |
| | Nv | 5.00E+18 | cm$^{-3}$ |
| | Thickness | 5 | nm |
| Conductor 116a, Conductor 116b | Work function | 4.6 | eV |
| Semiconductor 106b | Electron affinity | 4.6 | eV |
| | Eg | 2.8 | eV |
| | Relative permittivity | 15 | |
| | Donor density | 6.60E-09 | cm$^{-3}$ |
| | Electron mobility | 25 | cm$^2$/Vs |
| | Hole mobility | 0.01 | cm$^2$/Vs |
| | Nc | 5.00E+18 | cm$^{-3}$ |
| | Nv | 5.00E+18 | cm$^{-3}$ |
| | Thickness | 40 | nm |
| Region 124a, Region 124b | Donor density | 5.00E+18 | cm$^{-3}$ |
| Semiconductor 106a | Thickness | 10 | nm |
| Insulator 102 | Relative permittivity | 4.1 | |
| | Thickness | 300 | nm |

Note that Eg represents an energy gap, Nc represents an effective density of a conduction band, and Nv represents intrinsic carrier density of a valence band.

Then, h is 20 nm, W is 40 nm, Lg in the transistor structure A and the transistor structure B is 60 nm, and Lov in the transistor structure C is 20 nm. The electrical characteristics of these structures were measured with different L; 60 nm, 80 nm, 100 nm, 120 nm, 140 nm, and 260 nm. Each of Loff1 and Loff2 in the transistor structure A and the transistor structure B is (L−Lg)÷2, specifically 0 nm, 10 nm, 20 nm, 30 nm, 40 nm, and 100 nm. Note that the length of the semiconductor 106a and the semiconductor 106b in the L direction is L+120 nm.

Figure 4:
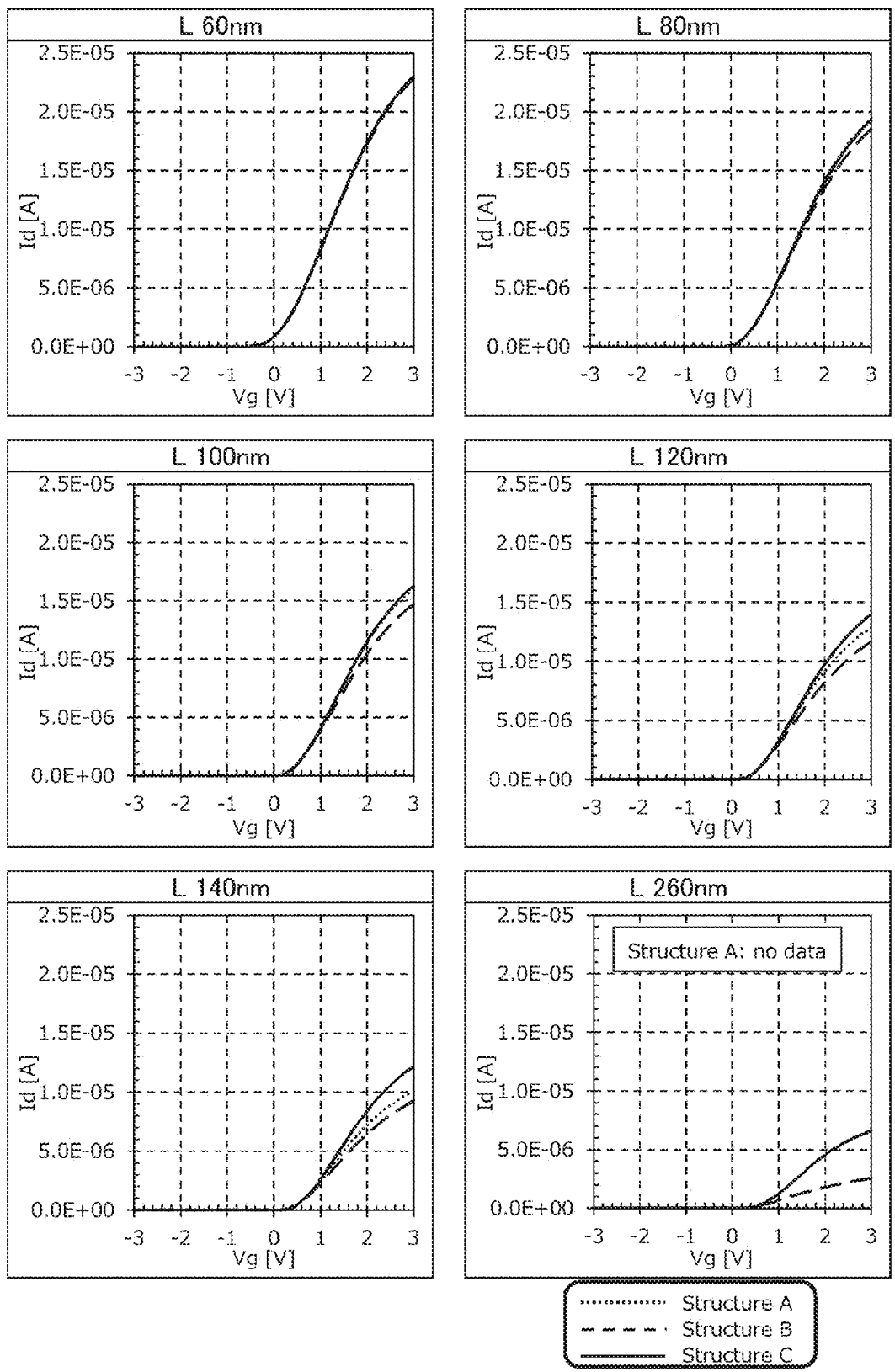
FIG. 4 shows the calculation results of electrical characteristics of transistors of embodiments of the present invention.
Figure 5:
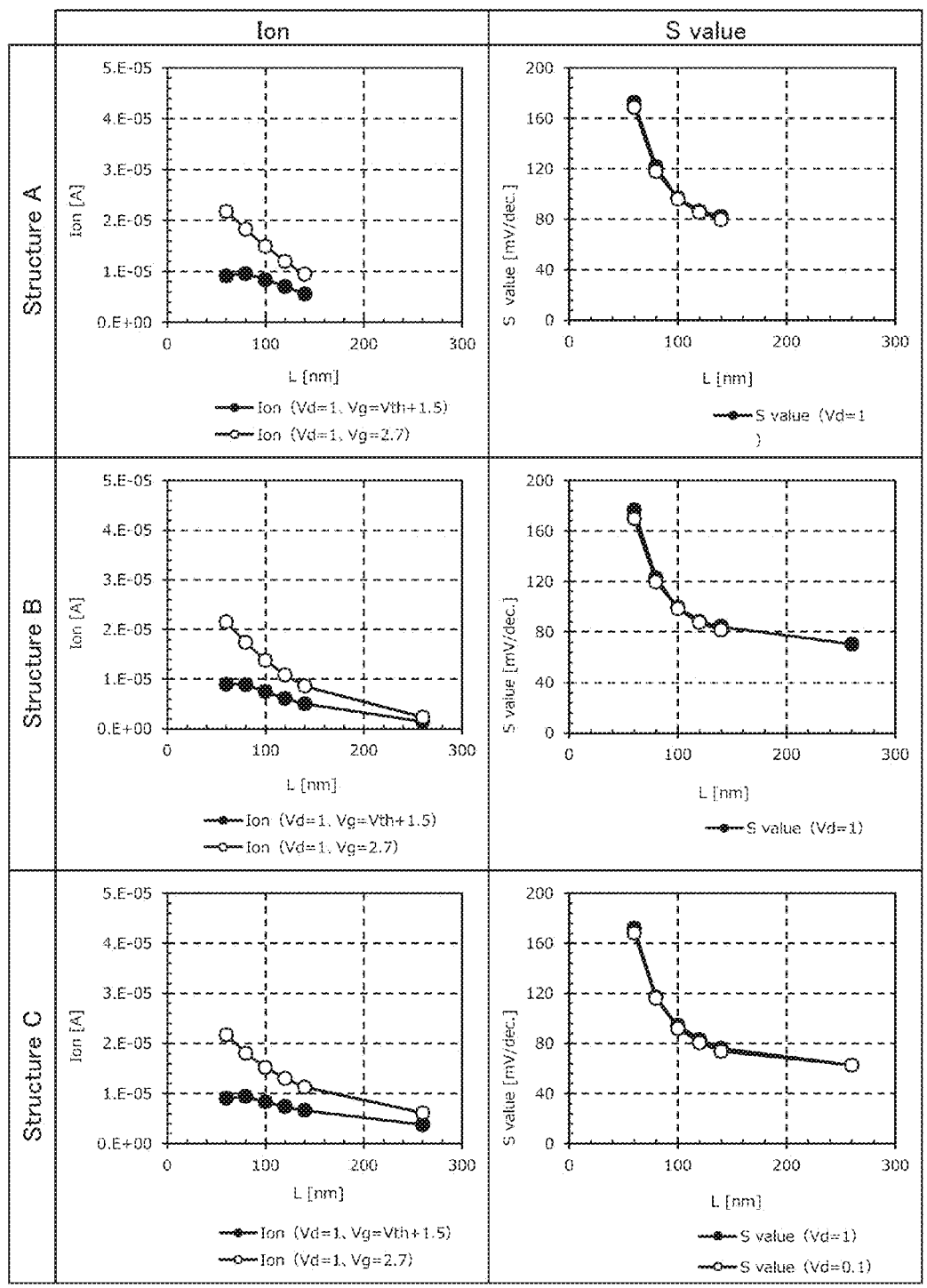
FIG. 5 shows the calculation results of electrical characteristics of transistors of embodiments of the present invention.

FIG. 4 shows the gate voltage (also referred to as Vg) versus drain current (also referred to as Id) characteristics obtained by the calculation. The characteristics of the transistor structure A, the transistor structure B, and the transistor structure C are represented with a dotted line, a dashed line, and a solid line, respectively, in FIG. 4. FIG. 5 shows the on-state currents and the subthreshold swing values (also referred to as S value) which are derived from the Vg-Id characteristics shown in FIG. 4. Note that the on-state current refers to a drain current in the case where the drain voltage (also referred to as Vd) is 1 V and the gate voltage is 2.7 V or the value obtained by adding 1.5 V to the threshold voltage (also referred to as Vth). The subthreshold swing value is a value when the drain voltage is 1 V or 0.1 V.

Figure 6:
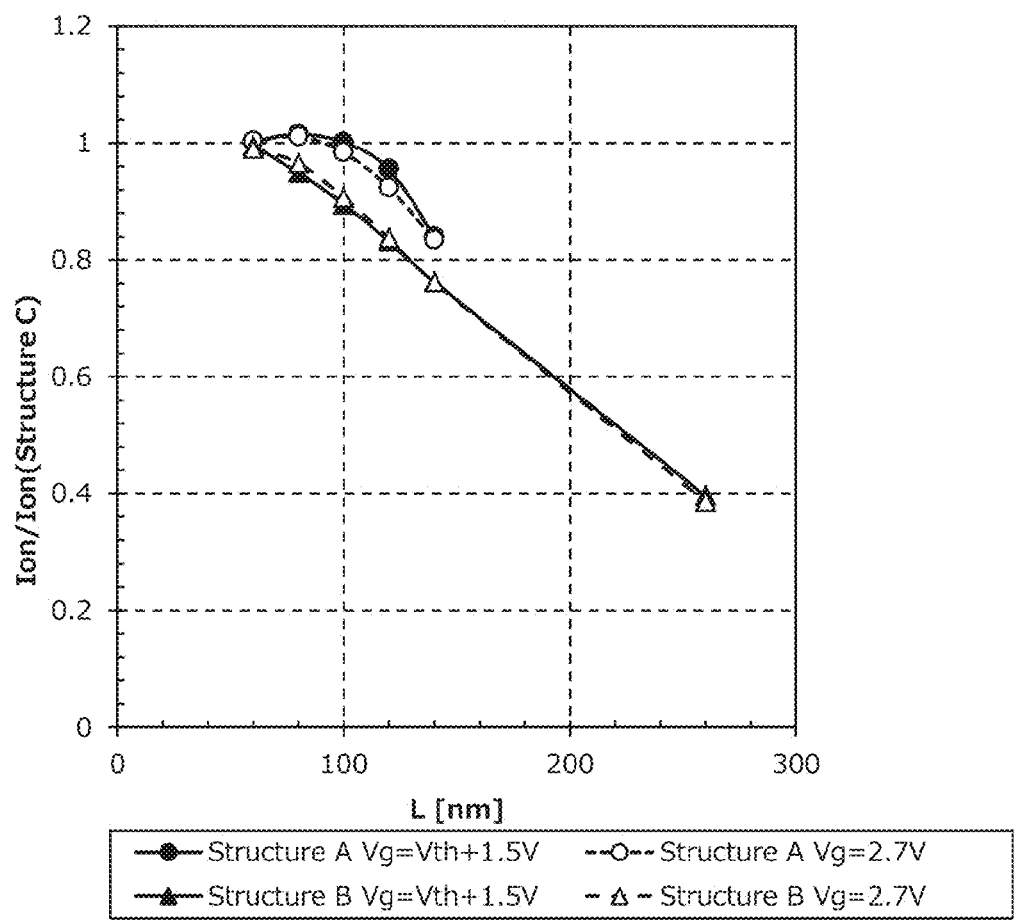
FIG. 6 shows the calculation results of electrical characteristics of transistors of embodiments of the present invention.

FIG. 6 shows the ratio of the on-state current of the transistor structure A to the on-state current of the transistor structure C and the ratio of the on-state current of the transistor structure B to the on-state current of the transistor structure C. As L is larger, a difference in on-state current between the transistor structure A and the transistor structure C and between the transistor structure B and the transistor structure C is larger.

On-state current of the transistor structure A is approximately 80%, approximately 90%, and approximately 98% of that of the transistor structure C even when L of the transistor structure A is 140 nm, 120 nm, and 100 nm, respectively. Note that the on-state current of the transistor structure A is higher than that of the transistor structure C when L is less than or equal to 80 nm. Therefore, there is little difference in on-state current between the transistor structure A and the transistor structure C as long as the offset region is not so large. Specifically, by setting Loff1 and Loff2 in the transistor structure A to 40 nm or less, preferably 30 nm or less, more preferably 20 nm or less, the transistor can have high on-state current and small parasitic capacitance.

On-state current of the transistor structure B is approximately 80%, approximately 90%, and approximately 95% of that of the transistor structure C even when L of the transistor structure A is 120 nm, 100 nm, and 80 nm, respectively. Therefore, there is little difference in on-state current between the transistor structure B and the transistor structure C as long as the offset region is not so large. Specifically, by setting Loff1 and Loff2 in the transistor structure C to 30 nm or less, preferably 20 nm or less, more preferably 10 nm or less, the transistor can have high on-state current and small parasitic capacitance.

The on-state current of each of the transistor structure A and the transistor structure B is rarely different from that of the transistor structure C, which suggests that a fringe electric field of the gate electrode (the conductor 104) contributes to the on-state current. That is, the fringe electric field probably induces carriers also in the offset region, so that the offset region does not become large resistance.

The contribution of the fringe electric field can be understood by comparing the transistor structure A with the transistor structure B. The transistor structure A differs from the transistor structure B in that it does not include the insulator 112 over the offset region. The insulator 108 has higher relative permittivity than the insulator 112. Therefore, the fringe electric field induces a larger number of carriers in the offset region, which is likely to suppress a decrease in on-state current. This means that the fringe electric field contributes to on-state current of a transistor having an offset region.

The thicker the conductor 104 is, the stronger the contribution of the fringe electric field is. Therefore, the conductor 104 is preferably thicker. For example, the thickness of the conductor 104 is 20 nm or larger, preferably 30 nm or larger, more preferably 50 nm or larger, still more preferably 100 nm or larger.

In the transistor structure A, the contribution of the fringe electric field is stronger as the relative permittivities of the semiconductor 106c and the insulator 108 are higher. Therefore, the relative permittivities of the semiconductor 106c and the insulator 108 are preferably higher. For example, the relative permittivity of the semiconductor 106c is 10 or higher, preferably 15 or higher, more preferably 20 or higher, still more preferably 25 or higher. In addition, the relative permittivity of the insulator 108 is, for example, 5 or higher, preferably 10 or higher, more preferably 15 or higher, still more preferably 20 or higher.

In the transistor structure B, the contribution of the fringe electric field is stronger as the relative permittivities of the semiconductor 106c, the insulator 112, and the insulator 108 are higher. Therefore, the relative permittivities of the semiconductor 106c, the insulator 112, and the insulator 108 are preferably higher. For example, the relative permittivity of the insulator 112 is 3 or higher, preferably 4 or higher, more preferably 6 or higher, still more preferably 10 or higher. For example, the relative permittivity of the semiconductor 106c is 10 or higher, preferably 15 or higher, more preferably 20 or higher, still more preferably 25 or higher. For example, the relative permittivity of the insulator 108 is, for example, 5 or higher, preferably 10 or higher, more preferably 15 or higher, still more preferably 20 or higher.

In the transistor structures A and B, the semiconductor 106b can be electrically surrounded by an electric field of the conductor 104 (a structure in which a semiconductor is electrically surrounded by an electric field of a conductor is referred to as a surrounded channel (s-channel) structure). Therefore, a channel is formed in the entire semiconductor 106b (bulk) in some cases. In the s-channel structure, a large amount of current can flow between a source and a drain of a transistor, so that a high on-state current can be obtained.

Owing to the s-channel structure, the contribution of the fringe electric field can reach the side surface of the semiconductor 106b. Consequently, the s-channel structure is suitable for reducing the resistance of the offset region by the fringe electric field.

<Transistor Structure 1>

Figure 7A:
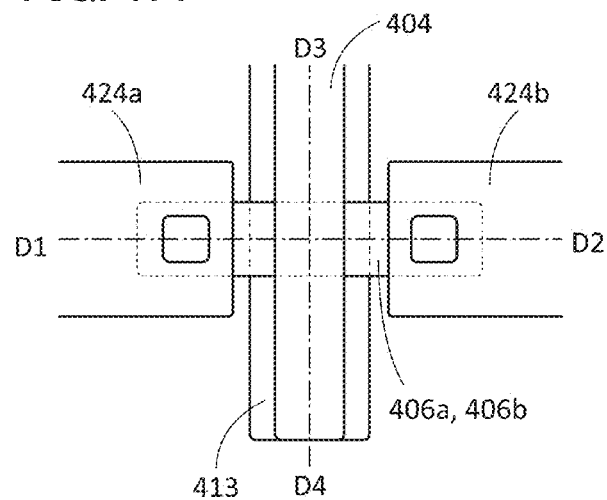
FIGS. 7A and 7B are a top view and a cross-sectional view illustrating a transistor of one embodiment of the present invention.
Figure 7B:
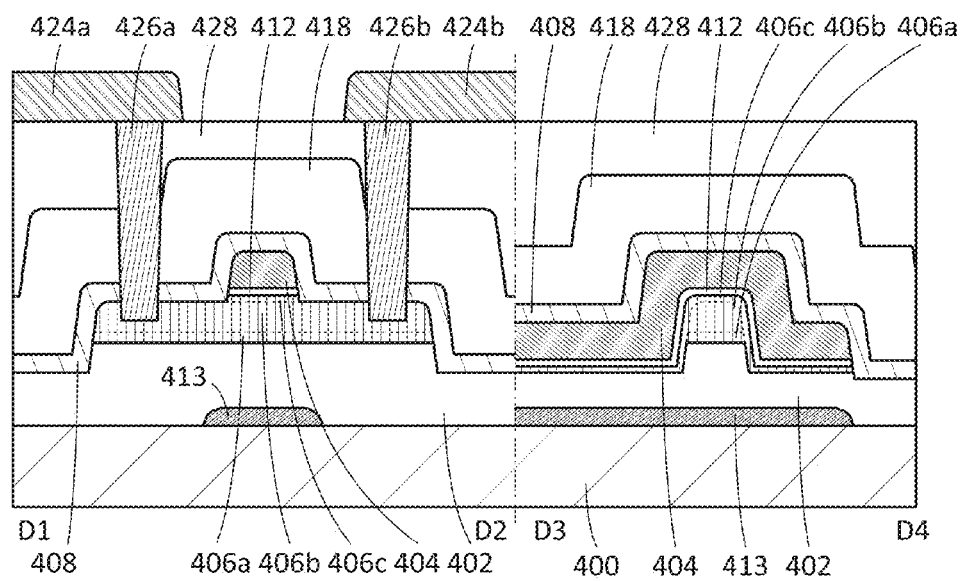

FIG. 7A is an example of a top view of a transistor of one embodiment of the present invention. FIG. 7B is a cross-sectional view taken along the dashed-dotted line D1-D2 and the dashed-dotted line D3-D4 in FIG. 7A. Note that some components such as an insulator are omitted in FIG. 7A for easy understanding.

The transistor illustrated in FIGS. 7A and 7B includes a conductor 413 over a substrate 400; an insulator 402 with a projecting portion over the substrate 400 and the conductor 413; a semiconductor 406a over the projecting portion of the insulator 402; a semiconductor 406b over the semiconductor 406a; a semiconductor 406c over the semiconductor 406b; an insulator 412 over the semiconductor 406c; a conductor 404 over the insulator 412; and an insulator 408 over the insulator 402, the semiconductor 406b, and the conductor 404. Here, the conductor 413 is part of the transistor, but is not limited to this. For example, the conductor 413 may be a component independent of the transistor.

The semiconductor 406b functions as a channel formation region of the transistor. The conductor 404 functions as a first gate electrode (also referred to as a front gate electrode) of the transistor. The conductor 413 functions as a second gate electrode (also referred to as a back gate electrode) of the transistor. The insulator 408 functions as a barrier layer. The insulator 408 has, for example, a function of blocking oxygen and/or hydrogen. Alternatively, the insulator 408 has, for example, a higher capability of blocking oxygen and/or hydrogen than the semiconductor 406a and/or the semiconductor 406c.

The transistor may be electrically connected to a conductor 424a and a conductor 424b through a conductor 426a, a conductor 426b, and the like. Note that the conductor 426a and the conductor 426b are electrically connected to a source region and a drain region of the transistor, respectively, through openings provided in the insulator 408, an insulator 418 over the insulator 408, and an insulator 428 over the insulator 418. The conductor 424a and the conductor 424b may function as wirings of a semiconductor device, for example.

Note that the semiconductor 406c has a region in contact with at least a top surface and a side surface of the semiconductor 406b in the cross section taken along line D3-D4. Furthermore, the conductor 404 faces the top surface and the side surface of the semiconductor 406b through the semiconductor 406c and the insulator 412 in the cross section taken along line D3-D4. The conductor 413 faces a bottom surface of the semiconductor 406b with the insulator 402 provided therebetween. The insulator 402 does not necessarily include a projection. The semiconductor 406c or the insulator 408 is not necessarily provided.

In the transistor illustrated in FIG. 7B, even when a region between a portion in contact with the conductor 426a and a portion of the semiconductor 406b which overlaps with the conductor 404 has high resistance, the fringe electric field of the conductor 404 reduces the resistance in the region; thus, on-state current of the transistor is unlikely to be reduced. The fringe electric field is referred to for the description made above using FIGS. 1A and 1B to FIG. 6.

Note that the region may have lower resistance than the other regions. The region may contain, for example, an inert element such as a rare gas, an element having a high bonding energy to oxygen, an element having a high reactivity to oxygen, or an element which forms stable oxide when bonded to oxygen. The region may contain, for example, one or more of helium, boron, carbon, nitrogen, neon, magnesium, aluminum, silicon, phosphorus, argon, calcium, titanium, vanadium, chromium, manganese, iron, cobalt, germanium, krypton, strontium, yttrium, zirconium, niobium, molybdenum, xenon, lanthanum, cerium, neodymium, hafnium, tantalum, and tungsten. The region may contain, for example, any of the above elements at a concentration higher than or equal to $5 \times 10^{19}$ atoms/cm$^3$, preferably higher than or equal to $1 \times 10^{20}$ atoms/cm$^3$, further preferably higher than or equal to $2 \times 10^{20}$ atoms/cm$^3$, or still further preferably higher than or equal to $5 \times 10^{20}$ atoms/cm$^3$. In this specification, the above elements might be referred to as impurities.

Although the case where the semiconductors 406a, 406b, and 406c are oxide semiconductors is described below, the semiconductors 406a, 406b, and 406c may be semiconductors other than oxide semiconductors.

The insulator 402 is an insulator containing excess oxygen.

The insulator containing excess oxygen means an insulator from which oxygen is released by heat treatment, for example. Silicon oxide containing excess oxygen means silicon oxide from which oxygen can be released by heat treatment or the like, for example. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406a.

The insulator containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such oxygen vacancies and forms electrons serving as carriers. Therefore, by reducing the oxygen vacancies in the semiconductor 406b, the transistor can have stable electrical characteristics.

Here, an insulator from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in TDS analysis in the range of a surface temperature of 100° C. to 700° C. or 100° C. to 500° C.

Here, a method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to Formula 1 using the TDS results of a silicon substrate containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having a mass number of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[Formula 1]}$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is expressed as $N_{H2}/S_{H2}$. Furthermore, $S_{O2}$ is the integral value of ion intensity in the TDS analysis of the measurement sample, and a is a coefficient affecting the ion intensity in the TDS analysis. Refer to Japanese Published Patent Application No. H6-275697 for details of the above formula. The amount of released oxygen is measured with, for example, a thermal desorption spectroscopy apparatus produced by ESCO Ltd., EMD-WA1000S/W using a silicon wafer containing hydrogen atoms at a concentration of $1 \times 10^{16}$ atoms/cm$^2$ as the reference sample.

Furthermore, in the TDS analysis, part of oxygen is detected as an oxygen atom. The ratio between oxygen molecules and oxygen atoms can be calculated from the ionization rate of the oxygen molecules. Since the above a includes the ionization rate of the oxygen molecules, the number of the released oxygen atoms can also be estimated through the evaluation of the number of the released oxygen molecules.

Here, $N_{O2}$ is the number of the released oxygen molecules. The amount of released oxygen converted into oxygen atoms is twice the number of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator containing excess oxygen may be oxygen-excess silicon oxide (SiO$_X$(X>2)). In the oxygen-excess silicon oxide (SiO$_X$(X>2)), the number of oxygen atoms per unit volume is larger than twice the number of silicon atoms per unit volume. The number of silicon atoms and the number of oxygen atoms per unit volume are measured by Rutherford backscattering spectrometry (RBS).

FIG. 7B illustrates an s-channel structure in which the semiconductor 406b can be electrically surrounded by the electric field of the conductor 404. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, or still further preferably less than or equal to 20 nm and the channel width of the transistor is preferably less than or equal to 40 nm, further preferably less than or equal to 30 nm, or still further preferably less than or equal to 20 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Furthermore, by applying a lower voltage or a higher voltage than a source electrode to the conductor 413, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductor 413 may be a variable or a fixed voltage. When the voltage applied to the conductor 413 is a variable, a circuit for controlling the voltage may be electrically connected to the conductor 413.

Next, an oxide semiconductor which can be used as the semiconductor 406a, the semiconductor 406b, the semiconductor 406c, or the like is described below.

The semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy to oxygen, for example. The element M is an element whose bonding energy to oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, such as a zinc tin oxide or a gallium tin oxide, an oxide semiconductor containing gallium, or an oxide semiconductor containing tin.

For the semiconductor 406b, an oxide with a wide energy gap is used. For example, the energy gap of the semiconductor 406b is greater than or equal to 2.5 eV and less than or equal to 4.2 eV, preferably greater than or equal to 2.8 eV and less than or equal to 3.8 eV, or further preferably greater than or equal to 3 eV and less than or equal to 3.5 eV.

For example, the semiconductor 406a and the semiconductor 406c include one or more elements other than oxygen included in the semiconductor 406b. Since the semiconductor 406a and the semiconductor 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably contain at least indium. In the case of using an In-M-Zn oxide as the semiconductor 406a, when summation of In and M is assumed to be 100 atomic %, the proportions of In and M are preferably set to be less than 50 atomic % and greater than or equal to 50 atomic %, respectively, or further preferably less than 25 atomic % and greater than 75 atomic %, respectively. In the case of using an In-M-Zn oxide as the semiconductor 406b, when summation of In and M is assumed to be 100 atomic %, the proportions of In and M are preferably set to be greater than or equal to 25 atomic % and less than 75 atomic %, respectively, or further preferably greater than or equal to 34 atomic % and less than 66 atomic %, respectively. In the case of using an In-M-Zn oxide as the semiconductor 406c, when summation of In and M is assumed to be 100 atomic %, the proportions of In and M are preferably set to be less than 50 atomic % and greater than or equal to 50 atomic %, respectively, or further preferably less than 25 atomic % and greater than 75 atomic %, respectively. Note that the semiconductor 406c may be an oxide that is a type the same as that of the semiconductor 406a.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy difference between the vacuum level and the bottom of the conduction band.

An indium gallium oxide has small electron affinity and a high oxygen-blocking property. Therefore, the semiconductor 406c preferably contains an indium gallium oxide. The gallium atomic ratio [Ga/(In+Ga)] is, for example, higher than or equal to 70%, preferably higher than or equal to 80%, or further preferably higher than or equal to 90%.

At this time, when a gate voltage is applied, a channel is formed in the semiconductor 406b having the highest electron affinity in the semiconductor 406a, the semiconductor 406b, and the semiconductor 406c.

Figure 32A:
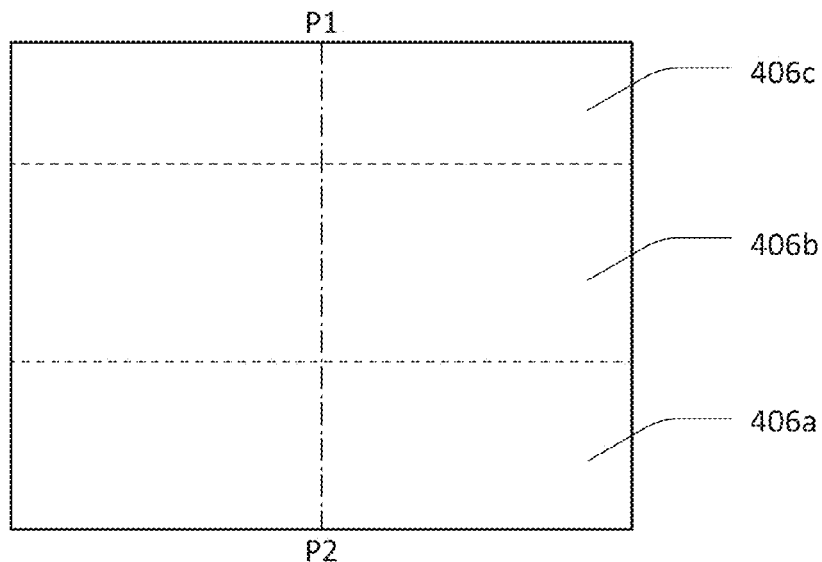
FIGS. 32A to 32C are a cross-sectional view and band diagrams illustrating a stacked structure of semiconductors.
Figure 32B:
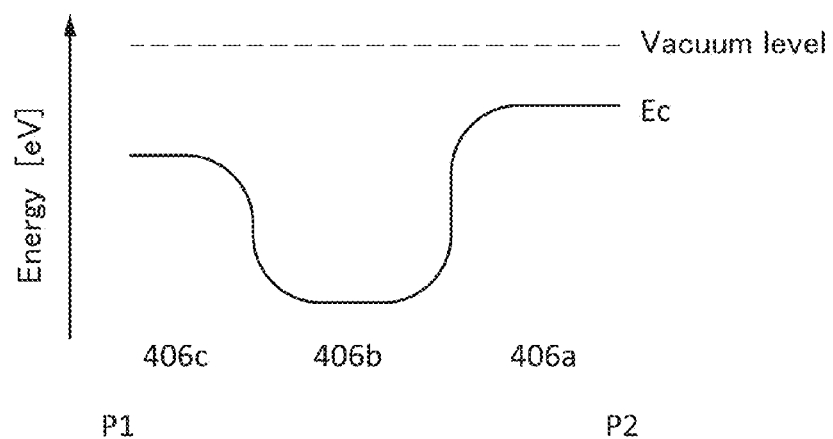
Figure 32C:
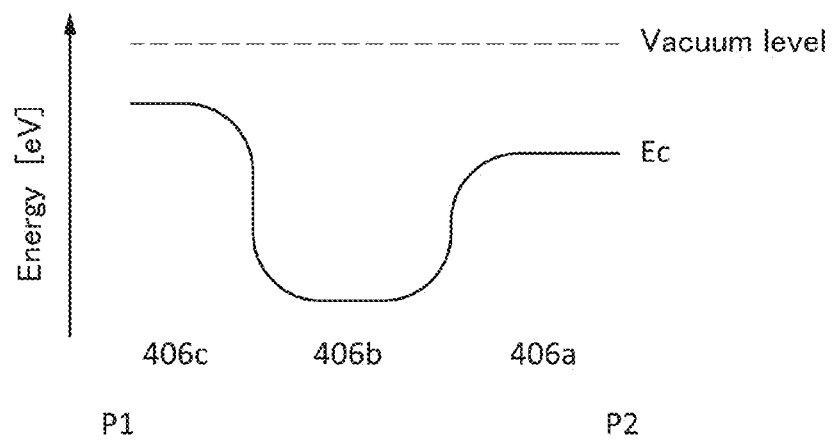

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low interface state density. For that reason, the stack of the semiconductor 406a, the semiconductor 406b, and the semiconductor 406c has a band structure where energy at each interface and in the vicinity of the interface is changed continuously (continuous junction). Note that FIG. 32A is a cross-sectional view in which the semiconductor 406a, the semiconductor 406b, and the semiconductor 406c are stacked in this order. FIG. 32B shows energy (Ec) at the bottom of the conduction band taken along the dashed-dotted line P1-P2 in FIG. 32A. FIG. 32B shows the case where the semiconductor 406c has a higher electron affinity than the semiconductor 406a. FIG. 32C shows the case where the semiconductor 406c has a lower electron affinity than the semiconductor 406a.

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 406b (a formation surface; here, the semiconductor 406a) is less than 1 nm, preferably less than 0.6 nm, further preferably less than 0.5 nm, or still further preferably less than 0.4 nm. The average surface roughness (also referred to as Ra) with the measurement area of 1 μm×1 μm is less than 1 nm, preferably less than 0.6 nm, further preferably less than 0.5 nm, or still further preferably less than 0.4 nm. The maximum difference (P–V) with the measurement area of 1 μm×1 μm is less than 10 nm, preferably less than 9 nm, further preferably less than 8 nm, or still further preferably less than 7 nm. Note that RMS roughness, Ra, and P–V can be measured using a scanning probe microscope SPA-500 manufactured by SII Nano Technology Inc.

Oxygen vacancies in an oxide semiconductor cause deterioration of electrical characteristics of the transistor in some cases. Accordingly, reducing oxygen vacancies in a channel formation region is important for the transistor to have stable electrical characteristics. On the other hand, in the case where an oxide semiconductor is used for a source region and a drain region of the transistor, oxygen vacanceis can cause the oxide semiconductor to have lower resistance. Thus, in some cases, presence of oxygen vacancies is preferred to increase the on-state current of the transistor.

For example, in the case were an oxide semiconductor contains oxygen vacancies (also denoted by Vo), donor levels are formed by entry of hydrogen into sites of oxygen vacancies in some cases. A state in which hydrogen enters sites of oxygen vacancies are denoted by VoH in the following description in some cases. Note that sites of oxygen vacancies become more stable by entry of oxygen than by entry of hydrogen. Thus, VoH can be reduced by supplying oxygen to the oxide semiconductor.

In the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness greater than or equal to 20 nm, preferably greater than or equal to 40 nm, further preferably greater than or equal to 60 nm, or still further preferably greater than or equal to 100 nm. Note that the semiconductor 406b has a region with a thickness, for example, less than or equal to 300 nm, preferably less than or equal to 200 nm, or further preferably less than or equal to 150 nm because the productivity of the semiconductor device might be decreased.

Moreover, the thickness of the semiconductor 406c is preferably as small as possible to increase the on-state current of the transistor. The thickness of the semiconductor 406c is less than 10 nm, preferably less than or equal to 5 nm, or further preferably less than or equal to 3 nm, for example. Meanwhile, the semiconductor 406c has a function of blocking elements other than oxygen (such as hydrogen and silicon) included in the adjacent insulator from entering the semiconductor 406b where a channel is formed. For this reason, it is preferable that the semiconductor 406c have a certain thickness. The thickness of the semiconductor 406c is greater than or equal to 0.3 nm, preferably greater than or equal to 1 nm, or further preferably greater than or equal to 2 nm, for example. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a has a region with a thickness, for example, greater than or equal to 10 nm, preferably greater than or equal to 20 nm, further preferably greater than or equal to 40 nm, or still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness, for example, less than or equal to 200 nm, preferably less than or equal to 120 nm, or further preferably less than or equal to 80 nm.

For example, a region in which the concentration of silicon which is measured by secondary ion mass spectrometry (SIMS) is lower than $1\times10^{19}$ atoms/cm$^3$, preferably lower than $5\times10^{18}$ atoms/cm$^3$, or further preferably lower than $2\times10^{18}$ atoms/cm$^3$ is provided between the semiconductor 406b and the semiconductor 406a. A region in which the concentration of silicon which is measured by SIMS is lower than $1\times10^{19}$ atoms/cm$^3$, preferably lower than $5\times10^{18}$ atoms/cm$^3$, or further preferably lower than $2\times10^{18}$ atoms/cm$^3$ is provided between the semiconductor 406b and the semiconductor 406c.

It is preferable to reduce the concentrations of hydrogen in the semiconductor 406a and the semiconductor 406c in order to reduce the concentration of hydrogen in the semiconductor 406b. The semiconductor 406a and the semiconductor 406c each have a region in which the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/ cm$^3$, or still further preferably lower than or equal to 5×10$^{18}$ atoms/cm$^3$. It is preferable to reduce the concentrations of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor 406b is preferably as low as possible. For example, the semiconductor 406b preferably has a region in which the concentration of copper is lower than or equal to 1×10$^{19}$ atoms/cm$^3$, lower than or equal to 5×10$^{18}$ atoms/cm$^3$, or lower than or equal to 1×10$^{18}$ atoms/cm$^3$. In addition, the concentration of copper on the surface of or in the semiconductor 406a is preferably as low as possible. For example, the semiconductor 406a preferably has a region in which the concentration of copper is lower than or equal to 1×10$^{19}$ atoms/cm$^3$, lower than or equal to 5×10$^{18}$ atoms/cm$^3$, or lower than or equal to 1×10$^{18}$ atoms/cm$^3$. Furthermore, the concentration of copper on the surface of or in the semiconductor 406c is preferably as low as possible. For example, the semiconductor 406c preferably has a region in which the concentration of copper is lower than or equal to 1×10$^{19}$ atoms/cm$^3$, lower than or equal to 5×10$^{18}$ atoms/cm$^3$, or lower than or equal to 1×10$^{18}$ atoms/cm$^3$.

The above three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided below or over the semiconductor 406a or below or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, below the semiconductor 406a, over the semiconductor 406c, and below the semiconductor 406c.

A structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

<Oxide Semiconductor Structure>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 27A:
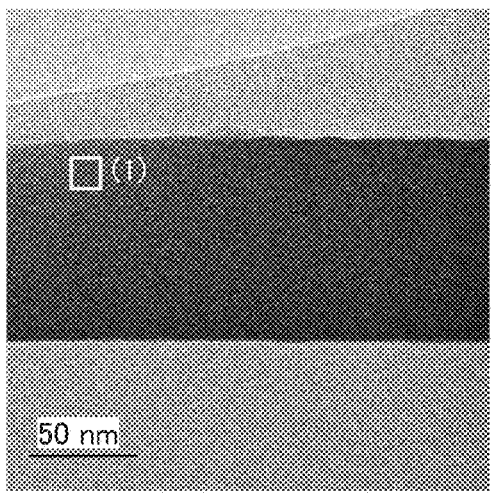
FIGS. 27A to 27D are Cs-corrected high-resolution TEM images of a cross section of a CAAC-OS and a cross-sectional schematic view of a CAAC-OS.

A CAAC-OS observed with TEM is described below. FIG. 27A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 27B:
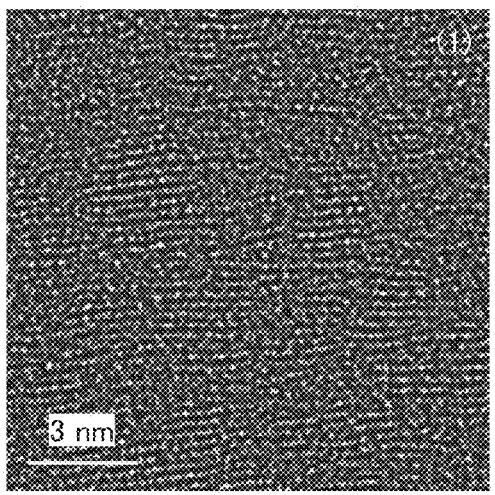

FIG. 27B is an enlarged Cs-corrected high-resolution TEM image of a region (1) in FIG. 27A. FIG. 27B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 27C:
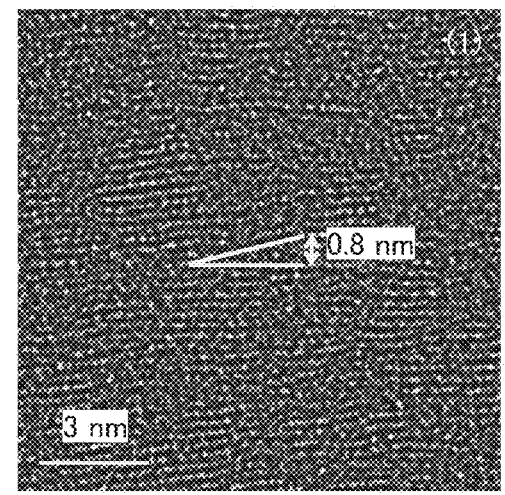

As shown in FIG. 27B, the CAAC-OS has a characteristic atomic arrangement. The characteristic atomic arrangement is denoted by an auxiliary line in FIG. 27C. FIGS. 27B and 27C prove that the size of a pellet is approximately 1 nm to 3 nm, and the size of a space caused by tilt of the pellets is approximately 0.8 nm. Therefore, the pellet can also be referred to as a nanocrystal (nc). A CAAC-OS can be referred to as an oxide semiconductor including c-axis aligned nanocrystals (CANC).

Figure 27D:
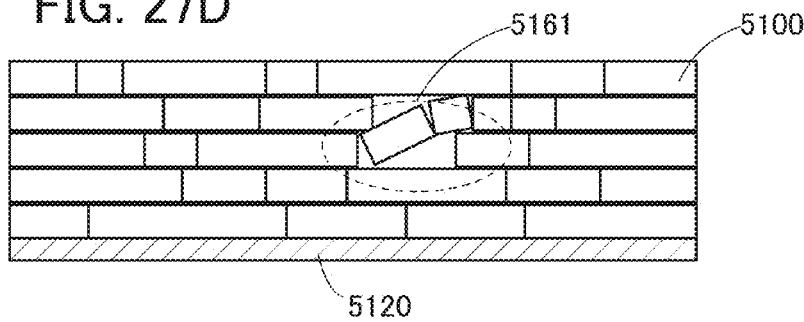

Here, according to the Cs-corrected high-resolution TEM images, the schematic arrangement of pellets 5100 of a CAAC-OS over a substrate 5120 is illustrated by such a structure in which bricks or blocks are stacked (see FIG. 27D). The part in which the pellets are tilted as observed in FIG. 27C corresponds to a region 5161 shown in FIG. 27D.

FIG. 28A shows a Cs-corrected high-resolution TEM image of a plane of the CAAC-OS observed from a direction substantially perpendicular to the sample surface. FIGS. 28B, 28C, and 28D are enlarged Cs-corrected high-resolution TEM images of regions (1), (2), and (3) in FIG. 28A, respectively. FIGS. 28B, 28C, and 28D indicate that metal atoms are arranged in a triangular, quadrangular, or hexagonal configuration in a pellet. However, there is no regularity of arrangement of metal atoms between different pellets.

Figure 29A:
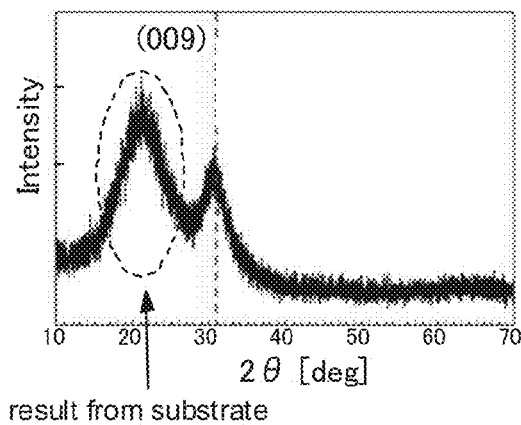
FIGS. 29A to 29C show XRD structural analysis of a CAAC-OS and a single crystal oxide semiconductor.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 29A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 29B:
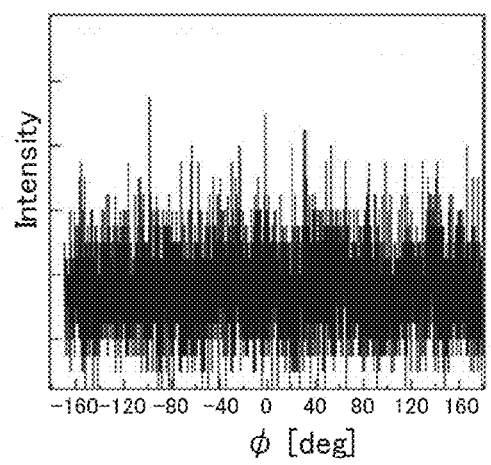
Figure 29C:
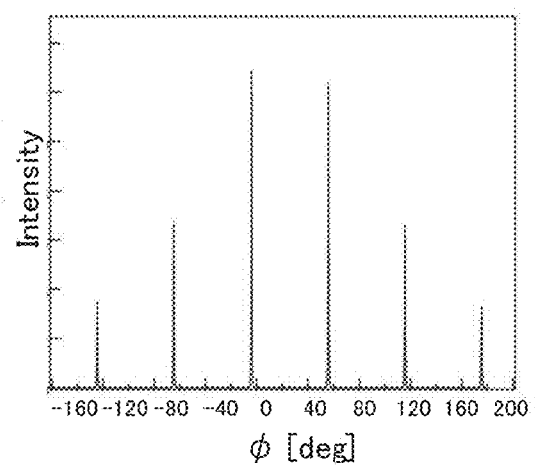

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 29B, a peak is not clearly observed. In contrast, in the case of a single crystal oxide semiconductor of $InGaZnO_4$, when φ scan is performed with 2θ fixed at around 56°, as shown in FIG. 29C, six peaks which are derived from crystal planes equivalent to the (110) plane are observed. Accordingly, the structural analysis using XRD shows that the directions of a-axes and b-axes are irregularly oriented in the CAAC-OS.

Figure 30A:
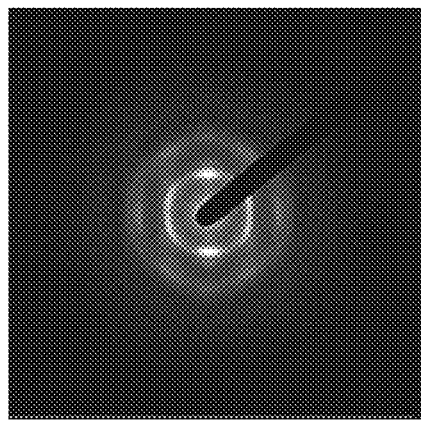
FIGS. 30A and 30B show electron diffraction patterns of a CAAC-OS.
Figure 30B:
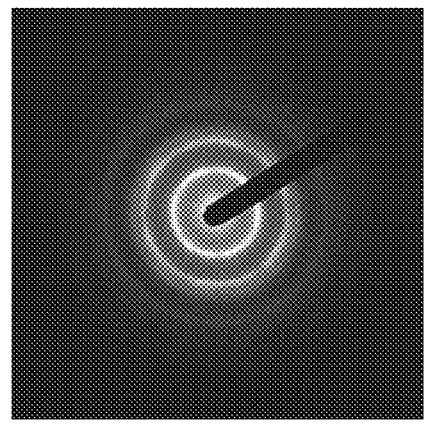

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 30A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 30B shows a diffraction pattern obtained in such a manner that an electron beam with a probe diameter of 300 nm is incident on the same sample in a direction perpendicular to the sample surface. As shown in FIG. 30B, a ring-like diffraction pattern is observed. Thus, the electron diffraction also indicates that the a-axes and b-axes of the pellets included in the CAAC-OS do not have regular alignment. The first ring in FIG. 30B is considered to be derived from the (010) plane, the (100) plane, and the like of the $InGaZnO_4$ crystal. The second ring in FIG. 30B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Specifically, the carrier density can be lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part with a size greater than or equal to 10 nm and less than or equal to 100 nm is referred to as a microcrystalline oxide semiconductor in some cases. In a high-resolution TEM image of the nc-OS, for example, a crystal grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is subjected to structural analysis by an out-of-plane method using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an a-like OS and an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<a-like OS>

An a-like OS is an oxide semiconductor having a structure intermediate between the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction.

The distance between the adjacent layers is equivalent to the lattice spacing on the (009) plane (also referred to as d value). Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 31:
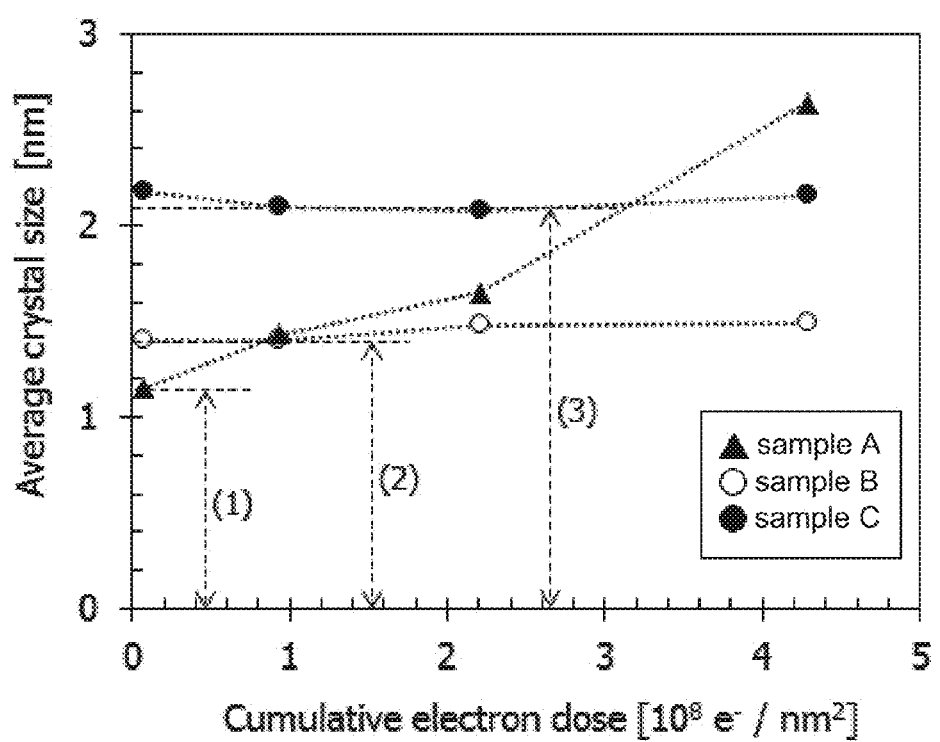
FIG. 31 shows a change in a crystal part of an In—Ga—Zn oxide induced by electron irradiation.

FIG. 31 shows change in the average size of crystal parts (at 22 points to 45 points) in each sample. Note that the crystal part size corresponds to the length of a lattice fringe. FIG. 31 indicates that the crystal part size in the a-like OS increases with an increase in the cumulative electron dose. Specifically, as shown by (1) in FIG. 31, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 31, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

In FIGS. 7A and 7B, as the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The conductor 413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Note that the insulator 402 may include an insulator containing nitrogen such as silicon nitride oxide or silicon nitride.

The insulator 402 may have a function of preventing diffusion of impurities from the substrate 400. In the case where the semiconductor 406b is an oxide semiconductor, the insulator 402 can have a function of supplying oxygen to the semiconductor 406b.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 is preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 is preferably formed to have a single-layer structure or a stacked-layer structure including an insulator containing silicon oxide or silicon oxynitride.

The insulator 428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 428 is preferably formed to have a single-layer structure or a stacked-layer structure including an insulator containing silicon oxide or silicon oxynitride.

The conductor 426a and the conductor 426b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The conductor 424a and the conductor 424b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 8A:
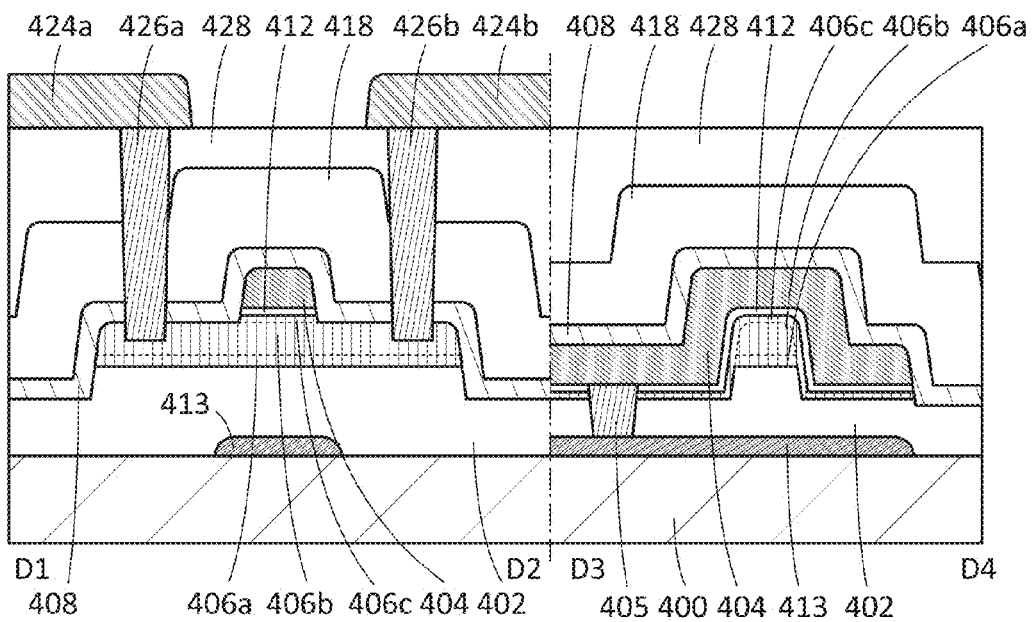
FIGS. 8A and 8B are cross-sectional views each illustrating a transistor of one embodiment of the present invention.
Figure 8B:
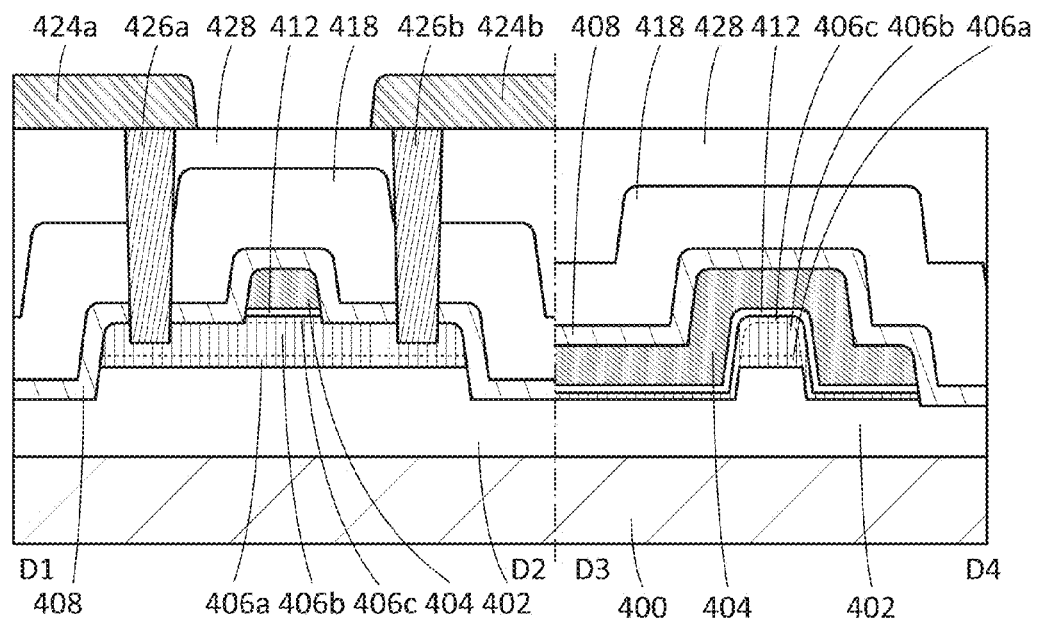

Although FIGS. 7A and 7B show an example in which the conductor 404 which is the first gate electrode of the transistor is not electrically connected to the conductor 413 which is the second gate electrode, a transistor structure of one embodiment of the present invention is not limited thereto. For example, as illustrated in FIG. 8A, the conductor 404 may be electrically connected to the conductor 413 through a conductor 405 or the like. With such a structure, the conductor 404 and the conductor 413 are supplied with the same potential; thus, switching characteristics of the transistor can be improved. Alternatively, as illustrated in FIG. 8B, the conductor 413 is not necessarily provided.

Figure 9A:
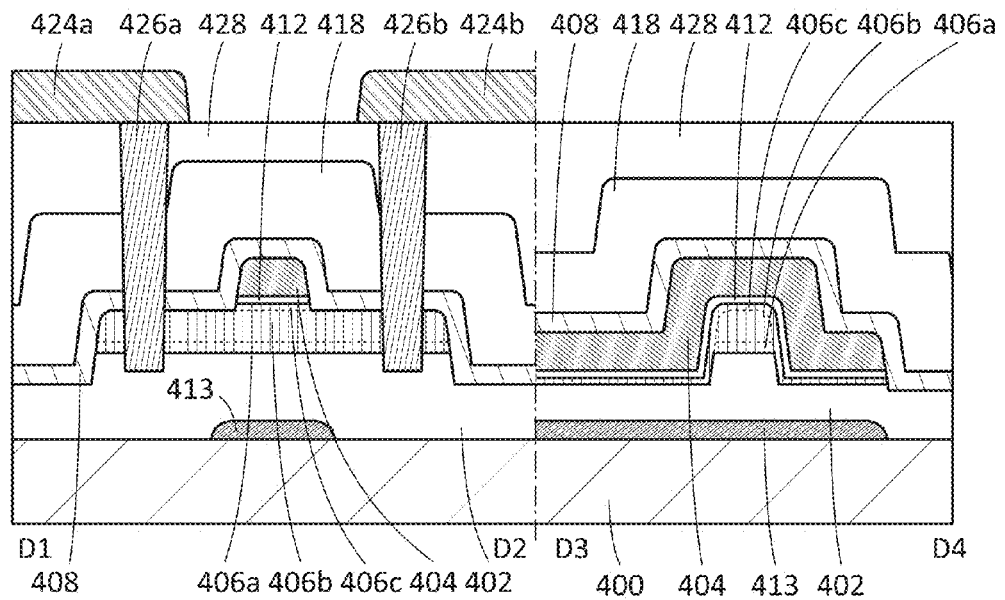
FIGS. 9A and 9B are cross-sectional views each illustrating a transistor of one embodiment of the present invention.
Figure 9B:
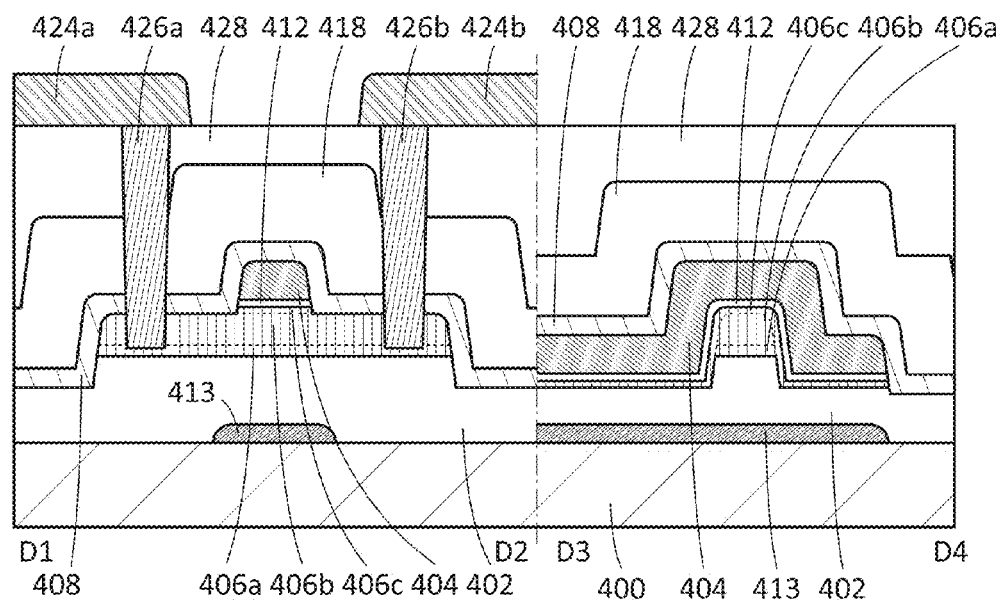

In addition, although FIGS. 7A and 7B show an example where the conductor 426a and the conductor 426b which are electrically connected to the source region and the drain region of the transistor, respectively, have regions in contact with the semiconductor 406b, a transistor structure of one embodiment of the present invention is not limited thereto. For example, as illustrated in FIG. 9A, the conductor 426a and the conductor 426b may penetrate the semiconductor 406b and the semiconductor 406a and have regions in contact with the insulator 402. Alternatively, as illustrated in FIG. 9B, the conductor 426a and the conductor 426b may penetrate the semiconductor 406b and have regions in contact with the semiconductor 406a.

Figure 10A:
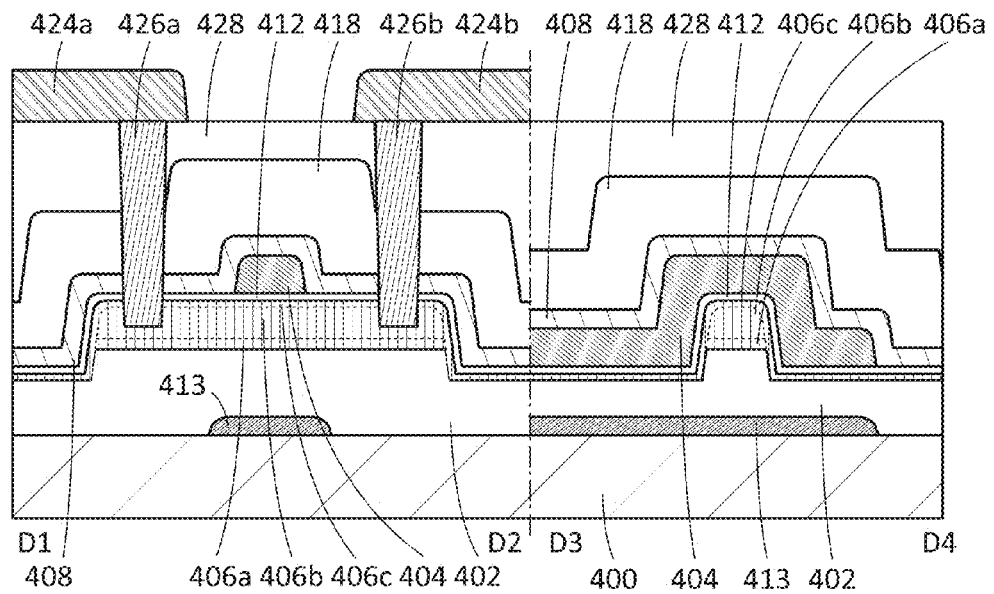
FIGS. 10A and 10B are cross-sectional views each illustrating a transistor of one embodiment of the present invention.
Figure 10B:
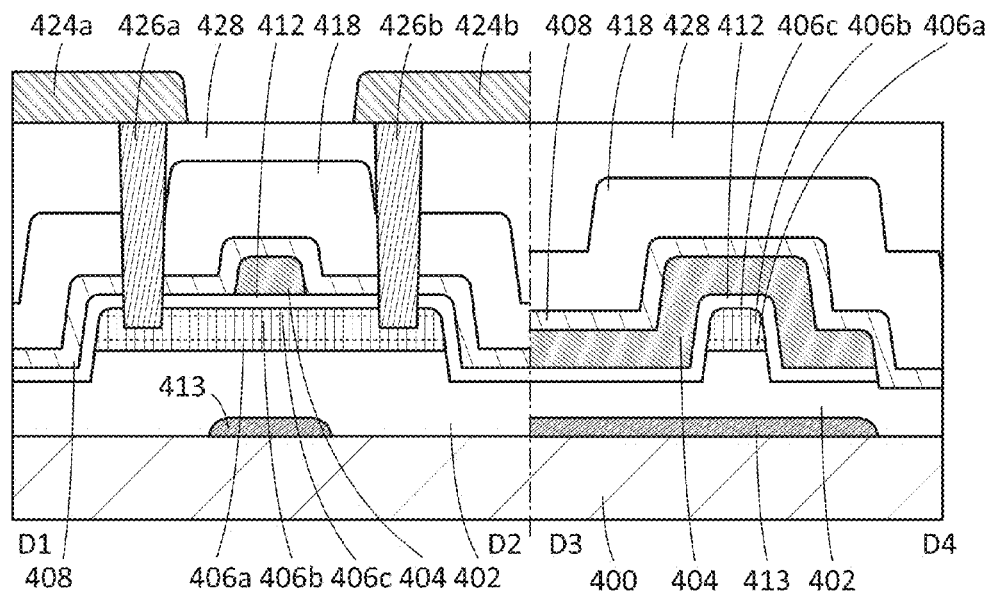

Furthermore, although FIGS. 7A and 7B show an example in which the semiconductor 406c and the insulator 412 are provided only in a region overlapping with the conductor 404, a transistor structure of one embodiment of the present invention is not limited thereto. For example, as illustrated in FIG. 10A, the semiconductor 406c and the insulator 412 may be provided so as to cover the semiconductor 406b and the semiconductor 406a. Alternatively, as illustrated in FIG. 10B, the semiconductor 406c may be provided so as to overlap with the semiconductor 406b, and the insulator 412 may be provided so as to cover the semiconductor 406c, the semiconductor 406b, and the semiconductor 406a.

<Transistor Structure 2>

Figure 11A:
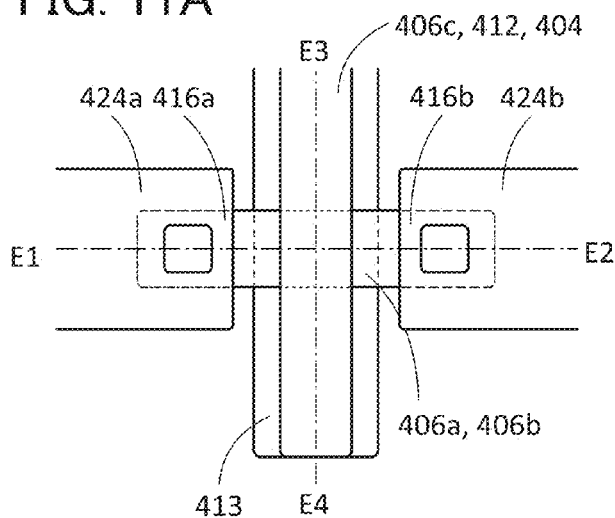
FIGS. 11A and 11B are a top view and a cross-sectional view illustrating a transistor of one embodiment of the present invention.
Figure 11B:
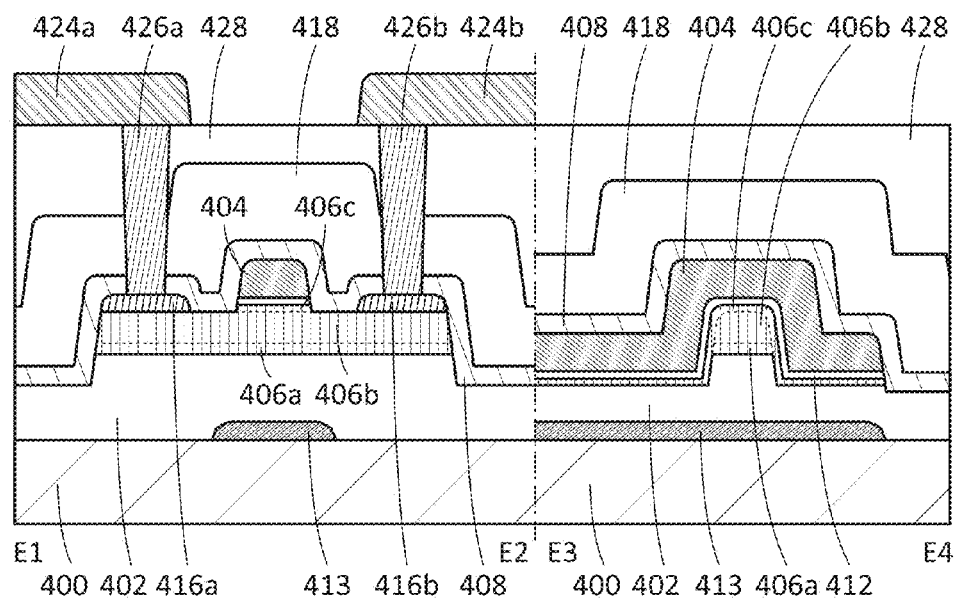

FIG. 11A is an example of a top view of a transistor of one embodiment of the present invention. FIG. 11B is an example of a cross-sectional view taken along dashed-dotted line E1-E2 and dashed-dotted line E3-E4 in FIG. 11A. Note that some components such as an insulator are omitted in FIG. 11A for easy understanding.

The transistor in FIGS. 11A and 11B includes the conductor 413 over the substrate 400, the insulator 402 having a projection over the substrate 400 and the conductor 413, the semiconductor 406a over the projection of the insulator 402, the semiconductor 406b over the semiconductor 406a, a conductor 416a and a conductor 416b which have regions in contact with a top surface of the semiconductor 406b and not in contact with side surfaces of the semiconductor 406b, the semiconductor 406c provided in a region which is over the semiconductor 406b and does not overlap with the conductor 416a and the conductor 416b, the insulator 412 over the semiconductor 406c, the conductor 404 over the insulator 412, and the insulator 408 over the insulator 402, the semiconductor 406b, and the conductor 404. Although the conductor 413 is part of the transistor in FIGS. 11A and 11B, a transistor structure of one embodiment of the present invention is not limited thereto. For example, the conductor 413 may be a component independent of the transistor.

The conductor 416a and the conductor 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The transistor in FIGS. 11A and 11B differs from the transistor in FIGS. 7A and 7B and the like in that the conductor 416a and the conductor 416b are included but the transistors are similar to each other in other components. Therefore, the description of the transistors in FIGS. 7A and 7B and the like can be referred to for the details of the transistor in FIGS. 11A and 11B.

Since the transistor in FIGS. 11A and 11B includes the conductor 416a and the conductor 416b, a transistor having a high on-state current compared with the transistors in FIGS. 7A and 7B and the like can be achieved in some cases.

<Transistor Structure 3>

Figure 12A:
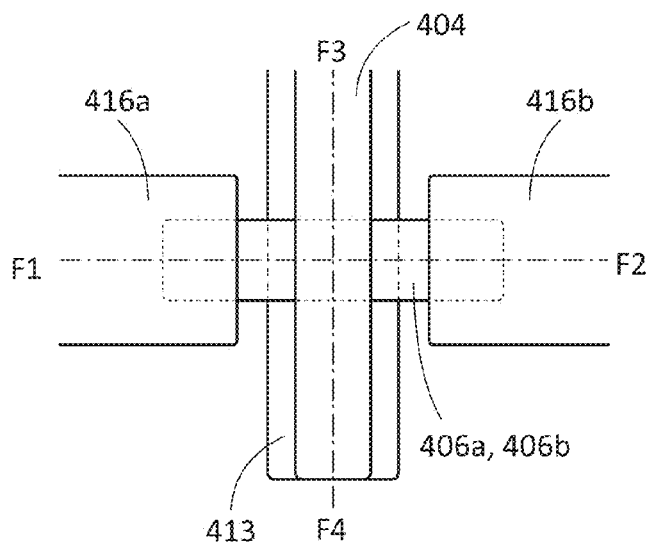
FIGS. 12A and 12B are a top view and a cross-sectional view illustrating a transistor of one embodiment of the present invention.
Figure 12B:
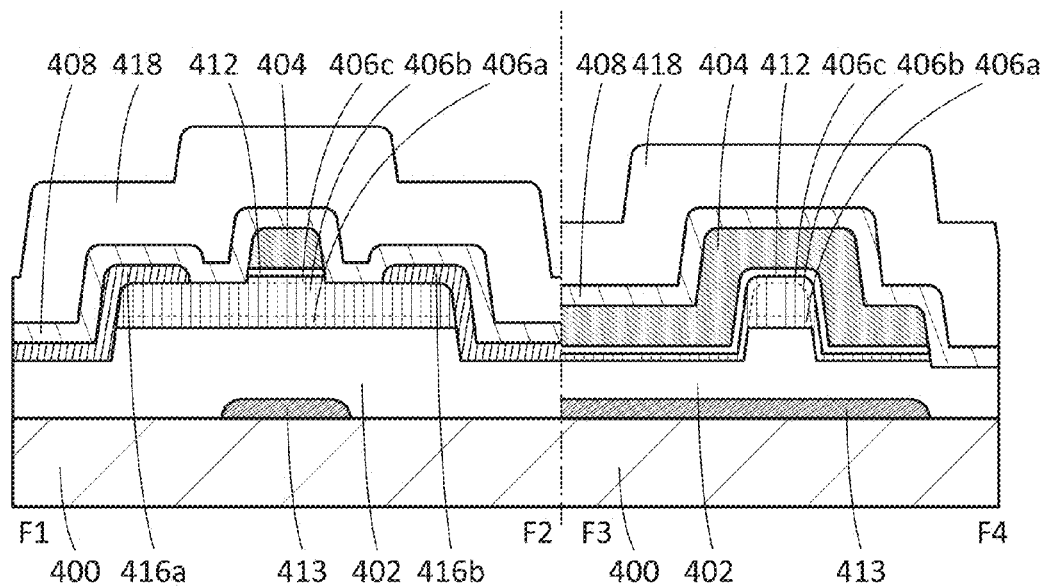

FIG. 12A is an example of a top view of a transistor of one embodiment of the present invention. FIG. 12B is an example of a cross-sectional view taken along dashed-dotted line F1-F2 and dashed-dotted line F3-F4 in FIG. 12A. Note that some components such as an insulator are omitted in FIG. 12A for easy understanding.

The transistor in FIGS. 12A and 12B includes the conductor 413 over the substrate 400, the insulator 402 having a projection over the substrate 400 and the conductor 413, the semiconductor 406a over the projection of the insulator 402, the semiconductor 406b over the semiconductor 406a, the conductor 416a and the conductor 416b which have regions in contact with a top surface and side surfaces of the semiconductor 406b, the semiconductor 406c provided in a region which is over the semiconductor 406b and does not overlap with the conductor 416a and the conductor 416b, the insulator 412 over the semiconductor 406c, the conductor 404 over the insulator 412, and the insulator 408 over the insulator 402, the semiconductor 406b, and the conductor 404. Although the conductor 413 is part of the transistor in FIGS. 12A and 12B, a transistor structure of one embodiment of the present invention is not limited thereto. For example, the conductor 413 may be a component independent of the transistor.

The transistor in FIGS. 12A and 12B differs from the transistor in FIGS. 11A and 11B in that the conductor 416a and the conductor 416b have regions in contact with the side surfaces of the semiconductor 406b but the transistors are similar to each other in other components. Therefore, the description of the transistors in FIGS. 11A and 11B and the like can be referred to for the details of the transistor in FIGS. 12A and 12B.

Since the conductor 416a and the conductor 416b of the transistor in FIGS. 12A and 12B have regions in contact with the side surfaces of the semiconductor 406b, a transistor having a high on-state current compared with that of the transistor in FIGS. 11A and 11B or the like can be achieved in some cases.

Figure 13A:
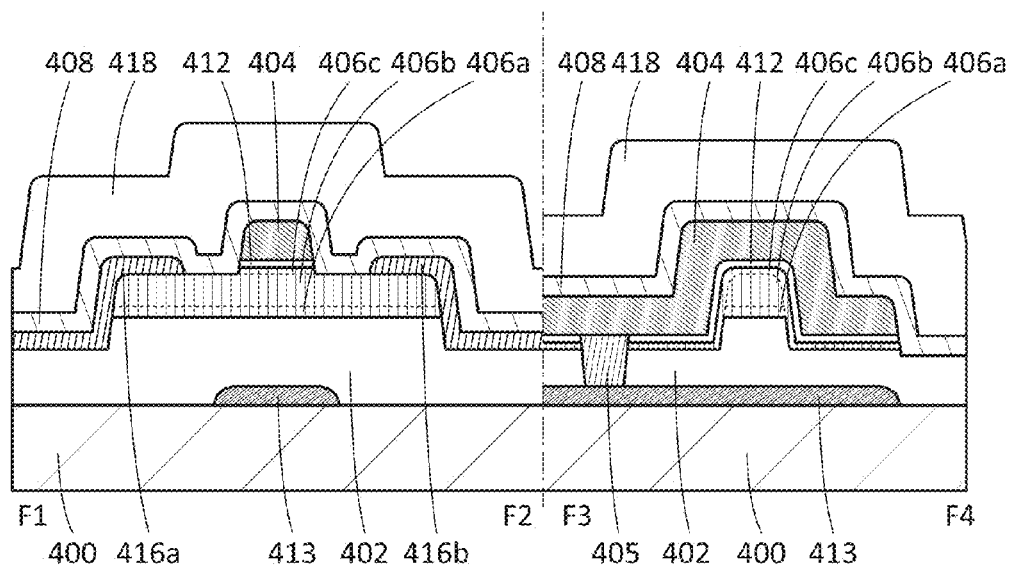
FIGS. 13A and 13B are cross-sectional views each illustrating a transistor of one embodiment of the present invention.
Figure 13B:
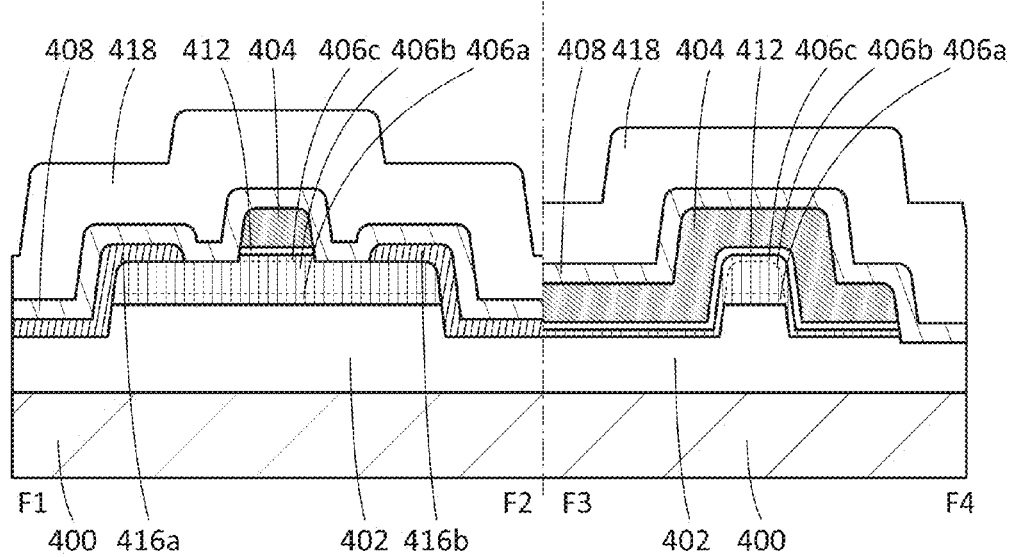

Although FIGS. 12A and 12B show an example in which the conductor 404 which is the first gate electrode of the transistor is not electrically connected to the conductor 413 which is the second gate electrode, a transistor structure of one embodiment of the present invention is not limited thereto. For example, as illustrated in FIG. 13A, the transistor may have a region where the conductor 404 is in contact with the conductor 413. With such a structure, the conductor 404 and the conductor 413 are supplied with the same potential; thus, switching characteristics of the transistor can be improved. Alternatively, as illustrated in FIG. 13B, the conductor 413 is not necessarily provided.

Figure 14A:
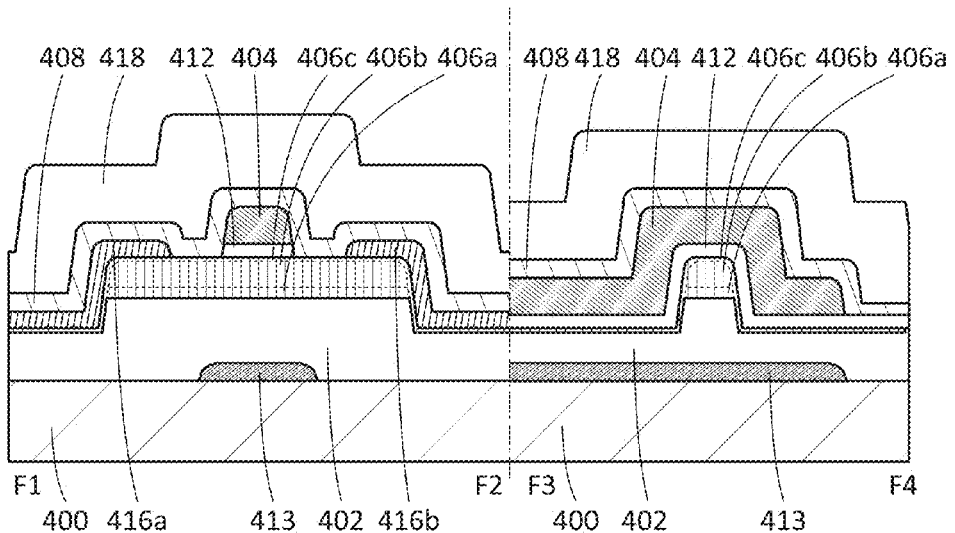
FIGS. 14A and 14B are cross-sectional views each illustrating a transistor of one embodiment of the present invention.
Figure 14B:
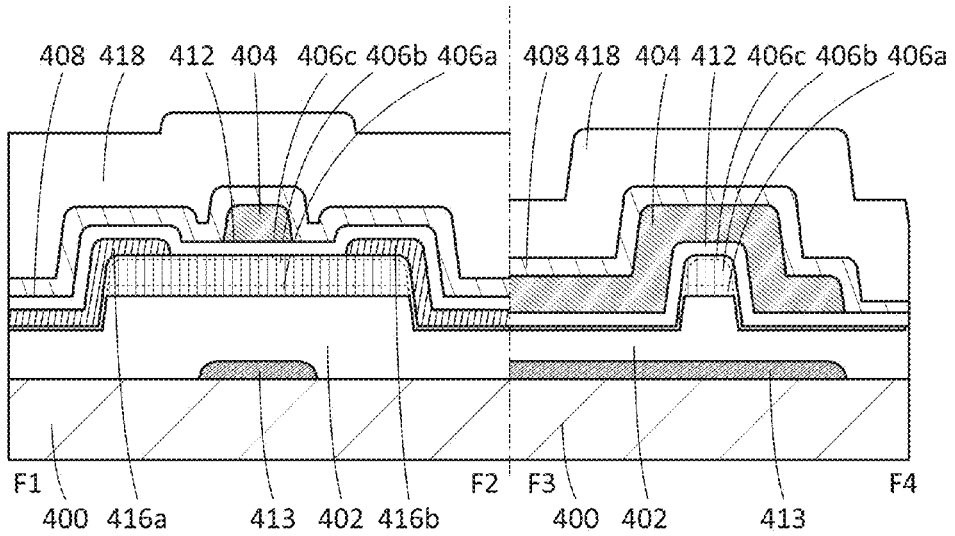

Furthermore, although FIGS. 12A and 12B show an example in which the semiconductor 406c and the insulator 412 are provided only in a region overlapping with the conductor 404, a transistor structure of one embodiment of the present invention is not limited thereto. For example, as illustrated in FIG. 14A, the semiconductor 406c may be provided so as to cover the semiconductor 406b and the semiconductor 406a. Alternatively, as illustrated in FIG. 14B, the semiconductor 406c may be provided so as to cover the semiconductor 406b and the semiconductor 406a, and the insulator 412 may be provided so as to cover the conductor 416a, the conductor 416b, the semiconductor 406c, the semiconductor 406b, and the semiconductor 406a.

<Transistor Structure 4>

Figure 15A:
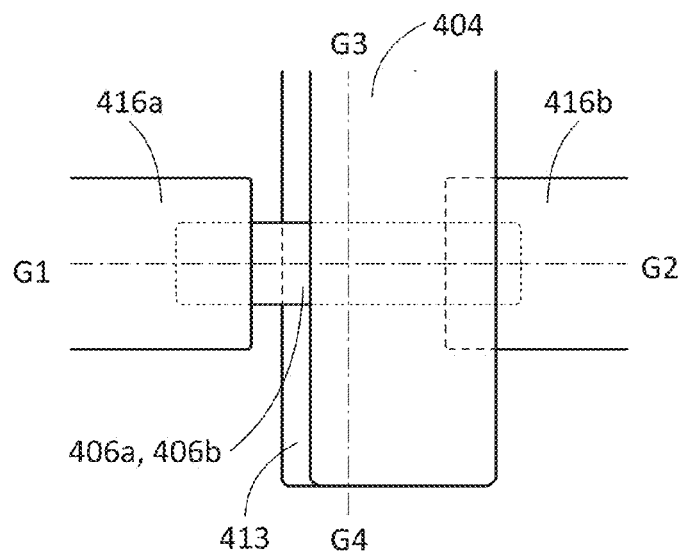
FIGS. 15A and 15B are a top view and a cross-sectional view illustrating a transistor of one embodiment of the present invention.
Figure 15B:
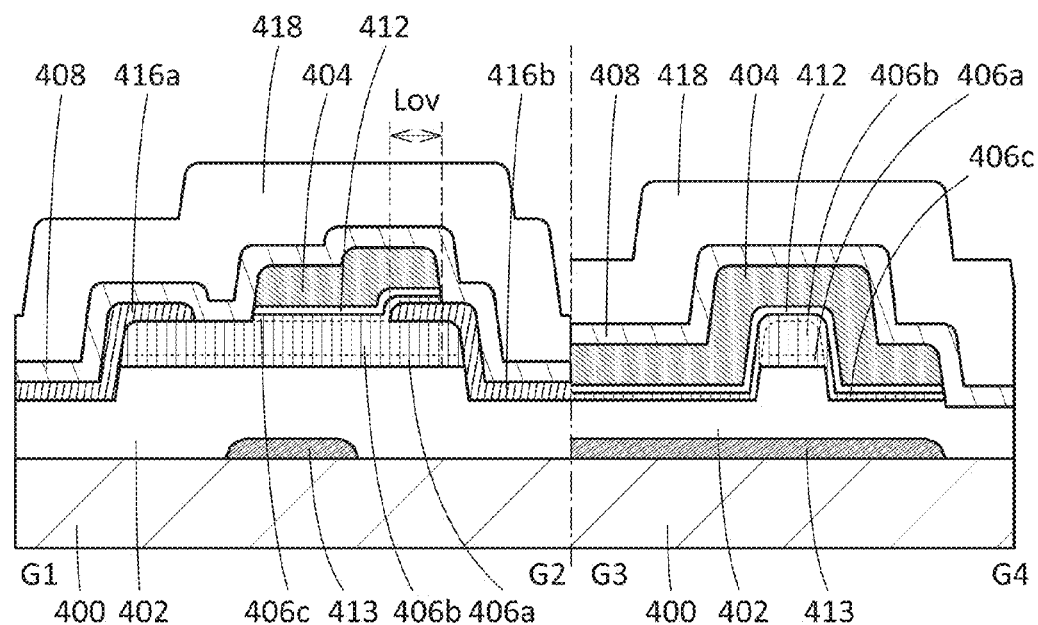

FIG. 15A is an example of a top view of a transistor of one embodiment of the present invention. FIG. 15B is an example of a cross-sectional view taken along dashed-dotted line G1-G2 and dashed-dotted line G3-G4 in FIG. 15A. Note that some components such as an insulator are omitted in FIG. 15A for easy understanding.

The transistor in FIGS. 15A and 15B includes the conductor 413 over the substrate 400, the insulator 402 having a projection over the substrate 400 and the conductor 413, the semiconductor 406a over the projection of the insulator 402, the semiconductor 406b over the semiconductor 406a, the conductor 416a and the conductor 416b which have regions in contact with a top surface and side surfaces of the semiconductor 406b, the semiconductor 406c provided in a region which is over the semiconductor 406b and does not overlap with the conductor 416a but overlap with the conductor 416b, the insulator 412 over the semiconductor 406c, the conductor 404 over the insulator 412, and the insulator 408 over the insulator 402, the semiconductor 406b, and the conductor 404. Note that the transistor in FIGS. 15A and 15B has a region in which the conductor 404 overlaps with the conductor 416b. Although the conductor 413 is part of the transistor in FIGS. 15A and 15B, a transistor structure of one embodiment of the present invention is not limited thereto. For example, the conductor 413 may be a component independent of the transistor.

The transistor in FIGS. 15A and 15B differs from the transistor in FIGS. 12A and 12B in that the conductor 404 has a region overlapping with the conductor 416b but the transistors are similar to each other in other components. Therefore, the description of the transistors in FIGS. 12A and 12B and the like can be referred to for the details of the transistor in FIGS. 15A and 15B.

Note that as illustrated in FIG. 15B, a region of the transistor in which the conductor 404 functioning as a gate electrode and the semiconductor 406b functioning as a channel formation region overlap with each other is referred to as an Lov region.

When the size of the Lov region is increased, parasitic capacitance is increased and thus switching characteristics of the transistor might be lowered. Therefore, the size of the Lov region in FIG. 15B is set to be less than 100% of the size of the channel formation region, preferably less than 80% thereof, or further preferably less than 50% thereof. The size of the Lov region is set to be, for example, less than 50 nm, preferably less than 20 nm, or further preferably less than 10 nm.

Since the transistor in FIGS. 15A and 15B has a region in which the conductor 404 overlaps with the conductor 416b, a transistor having a high on-state current compared with the transistor in FIGS. 12A and 12B and the like can be achieved in some cases.

The transistor structures described above are merely examples, and a transistor structure obtained by combining any of them is also included in the category of one embodiment of the present invention.

<Semiconductor Device>

An example of a semiconductor device of one embodiment of the present invention is shown below.

An example of a semiconductor device including a transistor of one embodiment of the present invention is shown below.

Figure 16A:
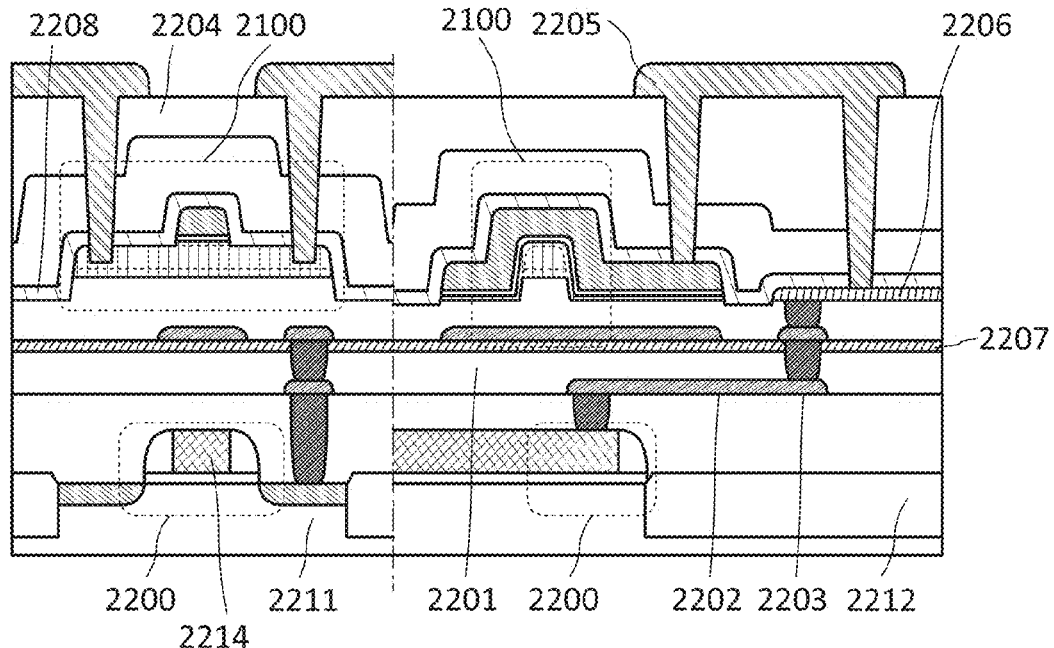
FIGS. 16A and 16B are each a cross-sectional view illustrating a semiconductor device of one embodiment of the present invention.

FIG. 16A is a cross-sectional view of a semiconductor device of one embodiment of the present invention. The semiconductor device illustrated in FIG. 16A includes a transistor 2200 using a first semiconductor in a lower portion and a transistor 2100 using a second semiconductor in an upper portion. FIG. 16A shows an example in which the transistor illustrated in FIGS. 11A and 11B is used as the transistor 2100 using the second semiconductor.

As the first semiconductor, a semiconductor having an energy gap different from that of the second semiconductor may be used. For example, the first semiconductor is a semiconductor other than an oxide semiconductor and the second semiconductor is an oxide semiconductor. As the first semiconductor, silicon, germanium, or the like which has a polycrystalline structure, a single crystal structure, or the like may be used. Alternatively, a semiconductor having distortion such as distorted silicon may be used. Alternatively, as the first semiconductor, gallium arsenide, aluminum gallium arsenide, indium gallium arsenide, gallium nitride, indium phosphide, silicon germanium, or the like which can be used for a high-electron-mobility transistor (HEMT) may be used. By using any of these semiconductors as the first semiconductor, the transistor 2200 capable of high speed operation can be obtained. By using an oxide semiconductor as the second semiconductor, the transistor 2100 with a low off-state current can be obtained.

Note that the transistor 2200 may be either an n-channel transistor or a p-channel transistor, and an appropriate transistor is used in accordance with a circuit. As the transistor 2100 and/or the transistor 2200, the above-described transistor or the transistor in FIG. 16A is not necessarily used in some cases.

The semiconductor device illustrated in FIG. 16A includes the transistor 2100 above the transistor 2200 with an insulator 2201 and an insulator 2207 provided therebetween. Between the transistor 2200 and the transistor 2100, a plurality of conductors 2202 which function as wirings are provided. Wirings or electrodes provided in an upper layer and a lower layer are electrically connected to each other by a plurality of conductors 2203 embedded in insulator. Furthermore, the semiconductor device includes an insulator 2204 over the transistor 2100, a conductor 2205 over the insulator 2204, and a conductor 2206 formed in the same layer (through the same steps) as a source electrode and a drain electrode of the transistor 2100.

The insulator 2204 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Note that the insulator 2204 may include an insulator containing nitrogen such as silicon nitride oxide or silicon nitride.

A resin may be used for the insulator 2204. For example, a resin containing polyimide, polyamide, acrylic, silicone, or the like may be used. The use of a resin does not need planarization treatment performed on the top surface of the insulator 2204 in some cases. By using a resin, a thick film can be formed in a short time; thus, the productivity can be increased.

By stacking a plurality of transistors, a plurality of circuits can be arranged with high density.

Here, in the case where single crystal silicon contained in a semiconductor substrate 2211 is used as the first semiconductor of the transistor 2200, the concentration of hydrogen in an insulator near the first semiconductor of the transistor 2200 is preferably high. The hydrogen terminates dangling bonds of silicon, so that the reliability of the transistor 2200 can be increased. On the other hand, in the case where an oxide semiconductor is used as the second semiconductor of the transistor 2100, the concentration of hydrogen in an insulator near the second semiconductor of the transistor 2100 is preferably low. The hydrogen causes generation of carriers in the oxide semiconductor, which might lead to a decrease in the reliability of the transistor 2100. Therefore, in the case where the transistor 2200 using single crystal silicon and the transistor 2100 using an oxide semiconductor are stacked, providing the insulator 2207 having a function of blocking hydrogen between the transistors is effective because the reliability of the transistors can be increased.

The insulator 2207 may be formed to have, for example, a single-layer structure or a stacked-layer structure including an insulator containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

Furthermore, an insulator having a function of blocking hydrogen is preferably formed over the transistor 2100 to cover the transistor 2100 using an oxide semiconductor. As the insulator, an insulator that is similar to the insulator 2207 can be used, and in particular, aluminum oxide is preferably used. The aluminum oxide film has a high blocking effect of preventing penetration of both oxygen and impurities such as hydrogen and moisture. Thus, by using the aluminum oxide film as an insulator 2208 covering the transistor 2100, release of oxygen from the oxide semiconductor included in the transistor 2100 can be prevented and entry of water and hydrogen into the oxide semiconductor can be prevented.

Figure 16B:
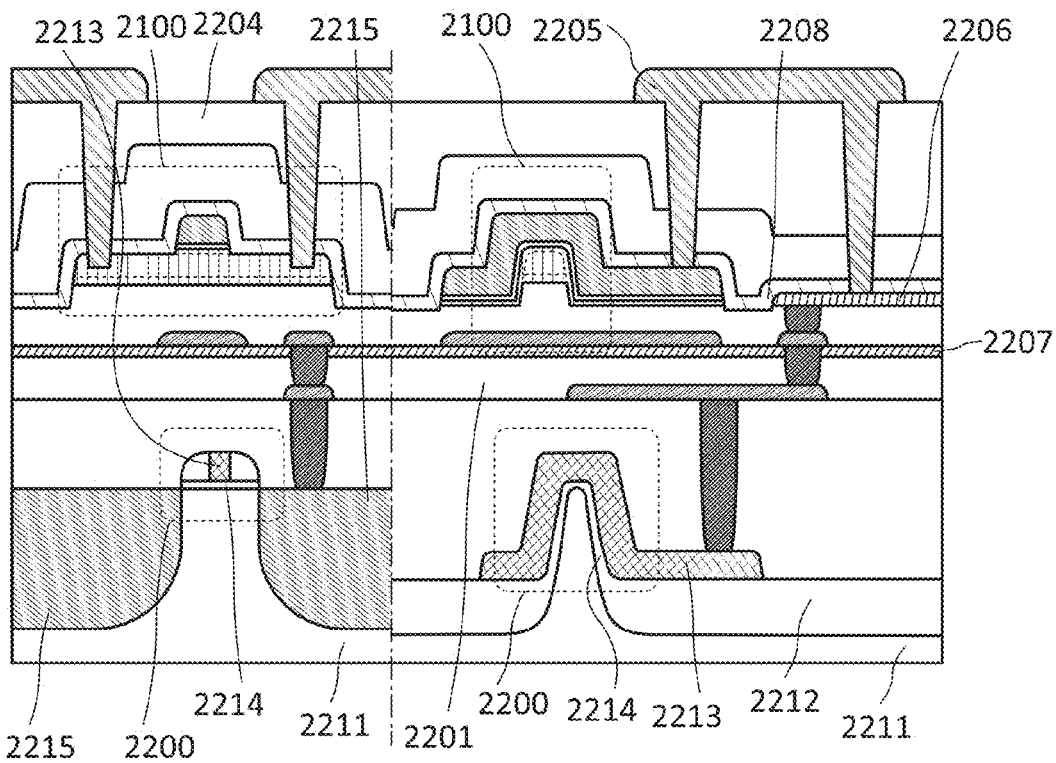

Note that the transistor 2200 can be a transistor of various types without being limited to a planar type transistor. For example, a FIN-type transistor can be used. An example of a cross-sectional view in this case is shown in FIG. 16B. An insulator 2212 is provided over the semiconductor substrate 2211. The semiconductor substrate 2211 includes a projection with a thin tip (also referred to a fin). Alternatively, the projection may not have the thin tip; a projection with a cuboid-like projection and a projection with a thick tip are permitted, for example. A gate insulator 2214 is provided over the projection of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projection; however, a semiconductor device of one embodiment of the present invention is not limited thereto. For example, a semiconductor region having a projection may be formed by processing an SOI substrate.

In the above circuit, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

Figure 17A:
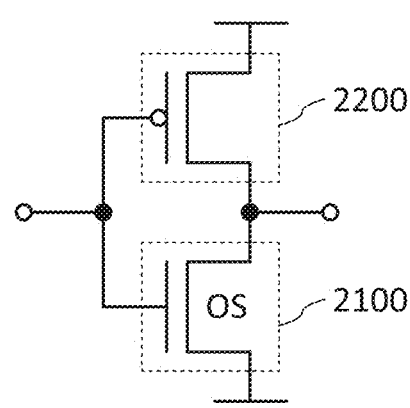
FIGS. 17A and 17B are each a circuit diagram illustrating a semiconductor device of one embodiment of the present invention.

A circuit diagram in FIG. 17A shows a configuration of a so-called CMOS inverter in which the p-channel transistor 2200 and the n-channel transistor 2100 are connected to each other in series and in which gates of them are connected to each other.

Figure 17B:
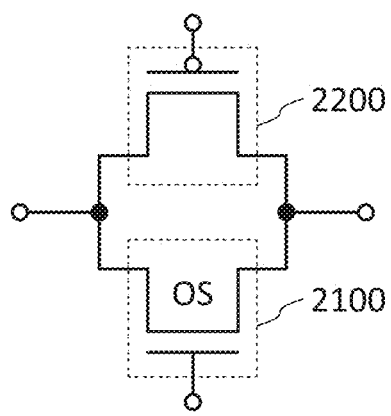

A circuit diagram in FIG. 17B shows a configuration in which sources of the transistors 2100 and 2200 are connected to each other and sources and drains of the transistors 2100 and 2200 are connected to each other. With such a configuration, the transistors can function as a so-called CMOS analog switch.

Figure 18A:
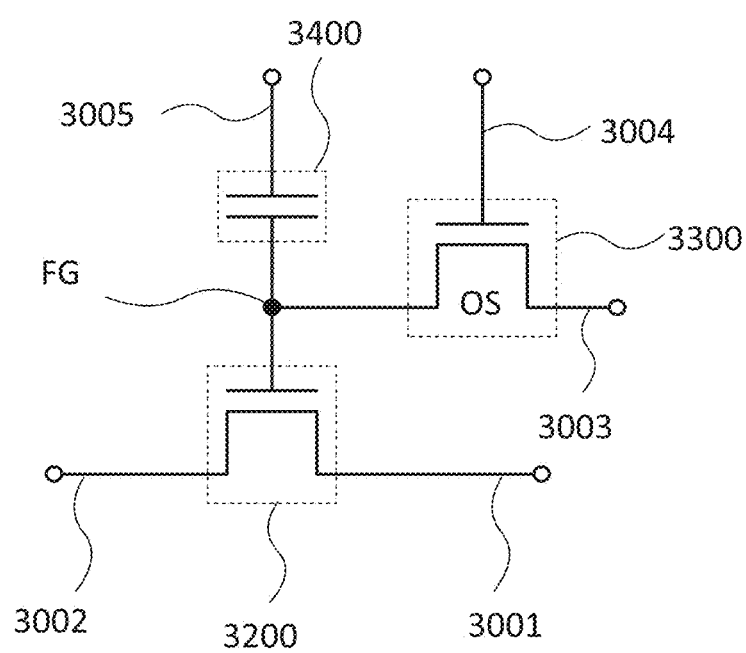
FIGS. 18A and 18B are each a circuit diagram illustrating a memory device of one embodiment of the present invention.
Figure 18B:
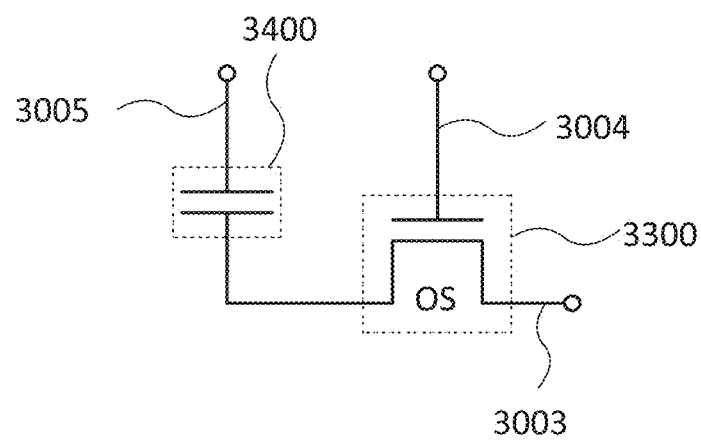

An example of a semiconductor device (memory device) which includes the transistor of one embodiment of the present invention, which can retain stored data even when not powered, and which has an unlimited number of write cycles is shown in FIGS. 18A and 18B.

The semiconductor device illustrated in FIG. 18A includes a transistor 3200 using a first semiconductor, a transistor 3300 using a second semiconductor, and a capacitor 3400. Note that any of the above-described transistors can be used as the transistor 3300.

The transistor 3300 is a transistor using an oxide semiconductor. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 18A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 18A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 18B is different from the semiconductor device in FIG. 18A in that the transistor 3200 is not provided. Also in this case, writing and retaining operation of data can be performed in a manner similar to that of the semiconductor device in FIG. 18A.

Reading of data in the semiconductor device in FIG. 18B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<RF Tag>

An RF tag including the transistor or the memory device is described below with reference to FIG. 19.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

A configuration of the RF tag will be described with reference to FIG. 19. FIG. 19 is a block diagram illustrating a configuration example of an RF tag.

Figure 19:
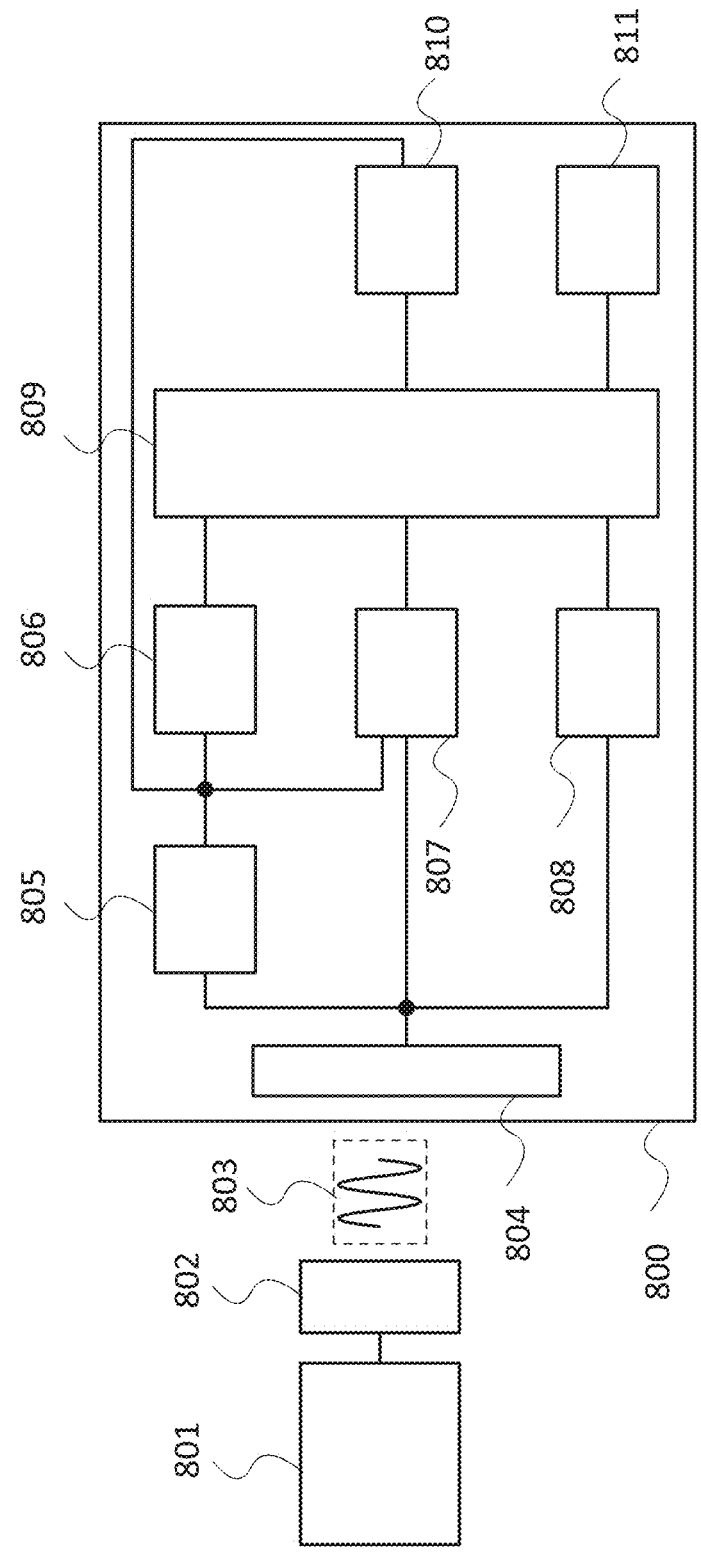
FIG. 19 is a block diagram illustrating an RF tag of one embodiment of the present invention.
Figure 20A:
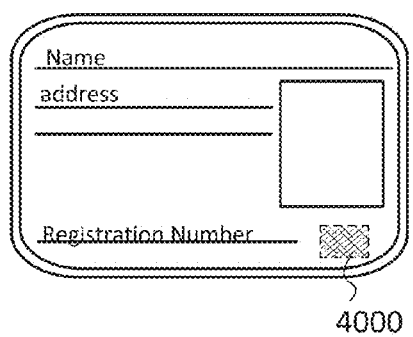
FIGS. 20A to 20F each illustrate an application example of an RF tag of one embodiment of the present invention.
Figure 20B:
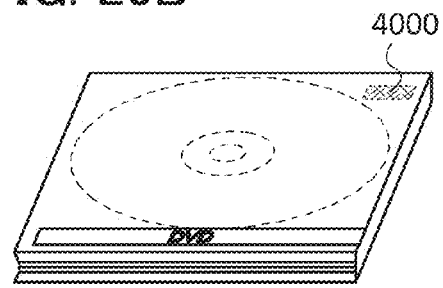
Figure 20C:
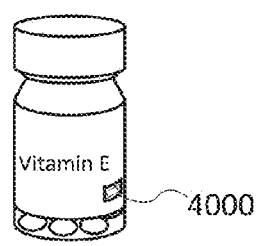
Figure 20D:
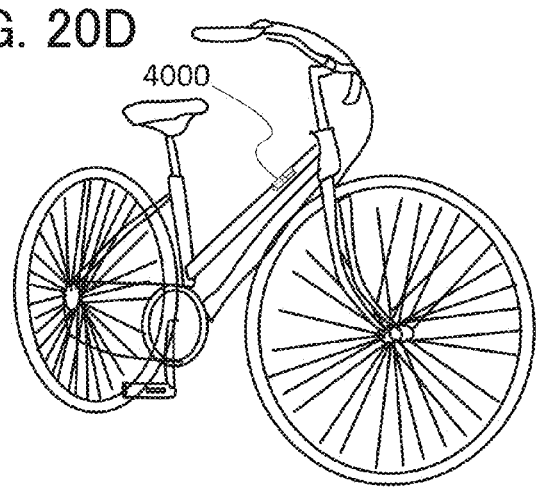
Figure 20E:
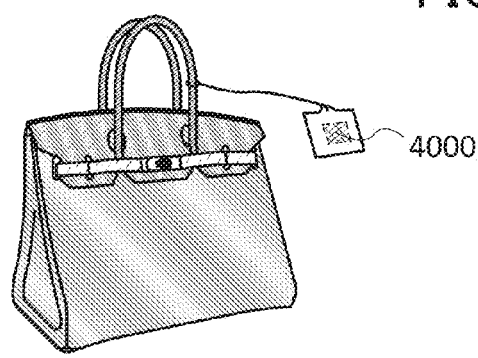
Figure 20F:
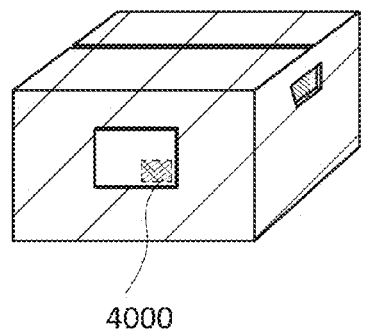

As shown in FIG. 19, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate as needed.

Here, the above-described memory device can be used as the memory circuit 810. Since the memory device of one embodiment of the present invention can retain data even when not powered, the memory device is suitable for an RF tag. Furthermore, the memory device of one embodiment of the present invention needs power (voltage) needed for data writing lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 20A to 20F. The RF tag is widely used and can be provided for, for example, products such as bills, coins, securities, bearer bonds, documents (e.g., driver's licenses or resident's cards, see FIG. 20A), packaging containers (e.g., wrapping paper or bottles, see FIG. 20C), recording media (e.g., DVDs or video tapes, see FIG. 20B), vehicles (e.g., bicycles, see FIG. 20D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 20E and 20F).

An RF tag 4000 of one embodiment of the present invention is fixed on products by, for example, being attached to a surface thereof or being embedded therein. For example, the RF tag 4000 is fixed to each product by being embedded in paper of a book, or embedded in an organic resin of a package. Since the RF tag 4000 can be reduced in size, thickness, and weight, it can be fixed to a product without spoiling the design of the product. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<CPU>

A CPU including a semiconductor device such as any of the above-described transistors or the above-described memory device is described below.

Figure 21:
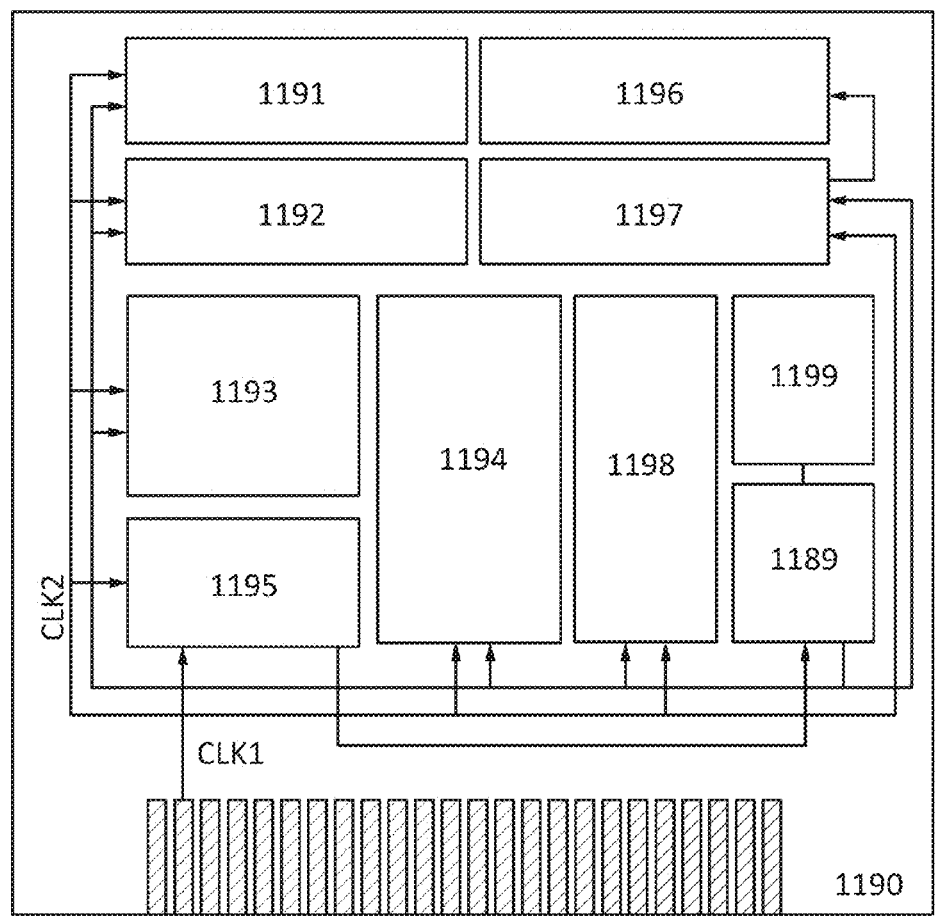
FIG. 21 is a block diagram illustrating a CPU of one embodiment of the present invention.

FIG. 21 is a block diagram illustrating a configuration example of a CPU including any of the above-described transistors as a component.

The CPU illustrated in FIG. 21 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface 1189. A semiconductor substrate, an SOI substrate, a glass substrate, or the like is used as the substrate 1190. The ROM 1199 and the ROM interface (ROM I/F) 1189 may be provided over a separate chip. Needless to say, the CPU in FIG. 21 is just an example in which the configuration has been simplified, and an actual CPU may have a variety of configurations depending on the application. For example, the CPU may have the following configuration: a structure including the CPU illustrated in FIG. 21 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 21, a memory cell is provided in the register 1196. For the memory cell of the register 1196, any of the above-described transistors, the above-described memory device, or the like can be used.

In the CPU illustrated in FIG. 21, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 22:
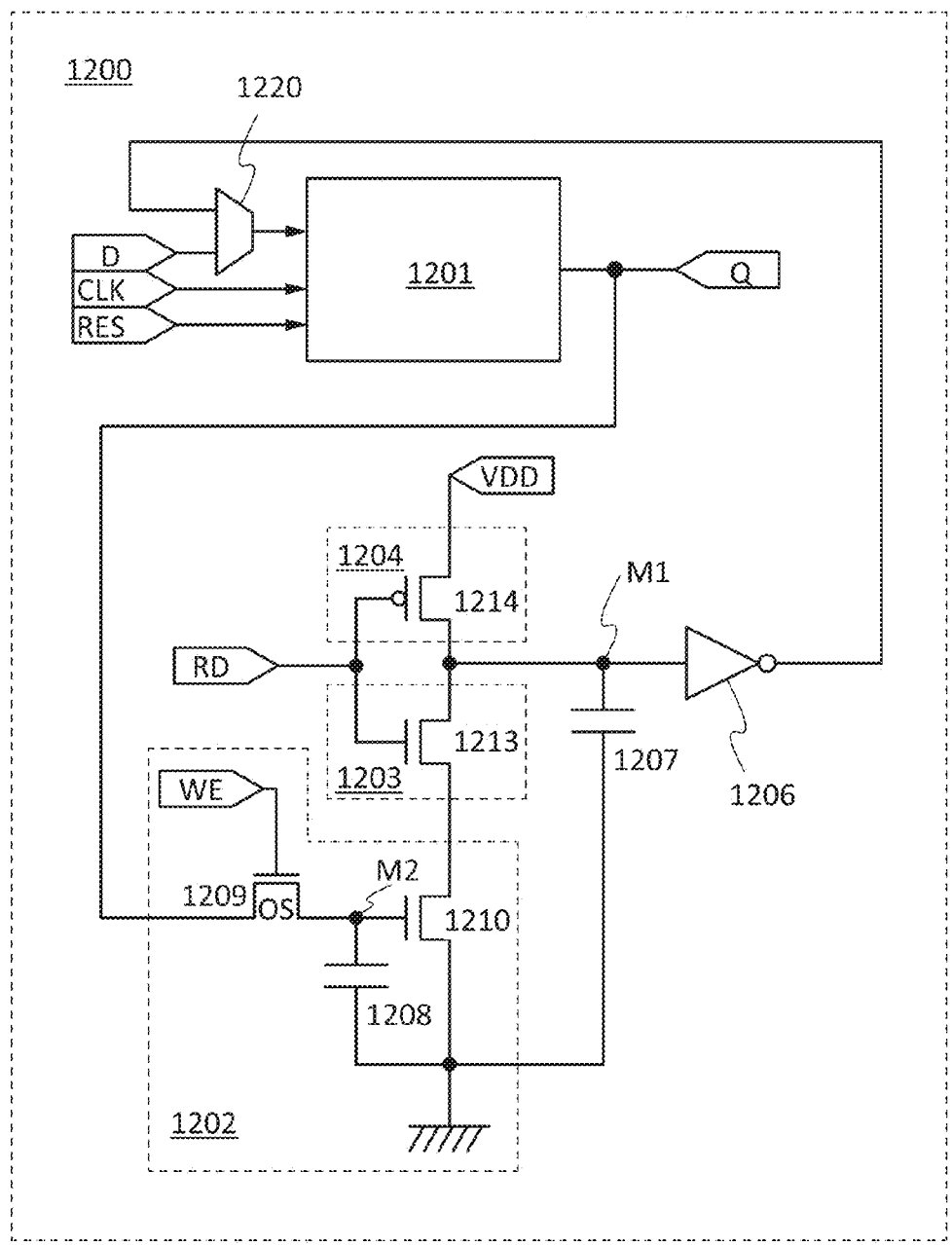
FIG. 22 is a circuit diagram of a memory element of one embodiment of the present invention.

FIG. 22 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 22 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 22, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 22, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in silicon or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 22, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Display Device>

The following shows configuration examples of a display device of one embodiment of the present invention.

[Configuration Example]

Figure 23A:
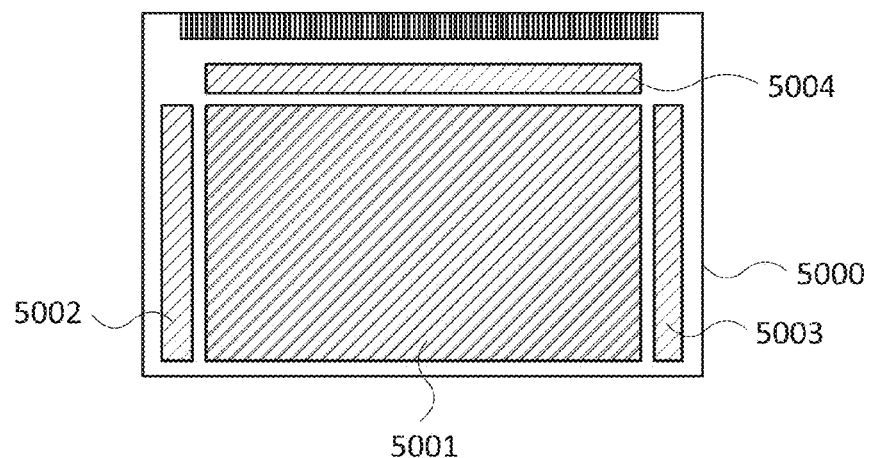
FIGS. 23A to 23C are a top view and circuit diagrams illustrating a display device of one embodiment of the present invention.
Figure 23B:
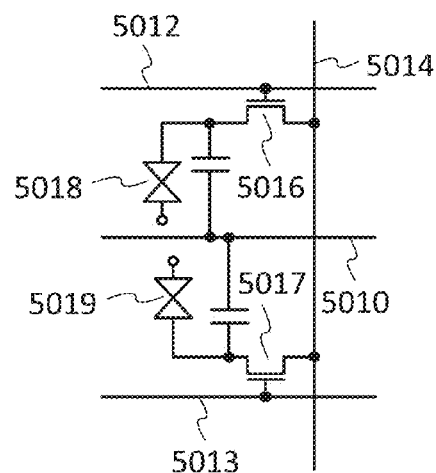
Figure 23C:
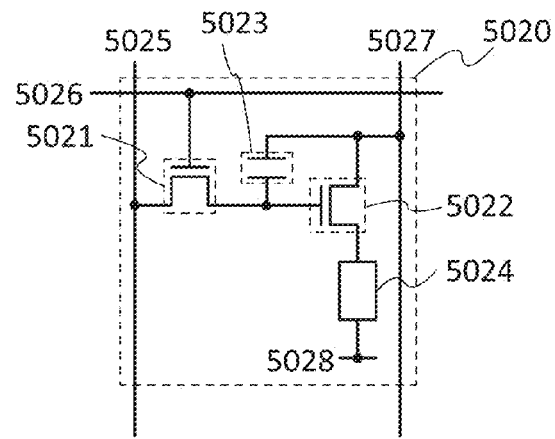

FIG. 23A is a top view of a display device of one embodiment of the present invention. FIG. 23B illustrates a pixel circuit where a liquid crystal element is used for a pixel of a display device of one embodiment of the present invention. FIG. 23C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor formed through the same steps as the transistor used for the pixel may be used for a driver circuit. Thus, by using any of the above-described transistors for a pixel or a driver circuit, the display device can have a high display quality and/or high reliability.

FIG. 23A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Furthermore, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 23B shows an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, the liquid crystal display device can have a high display quality and/or high reliability.

The shapes of a first pixel electrode electrically connected to the transistor 5016 and a second pixel electrode electrically connected to the transistor 5017 are described. The first pixel electrode and the second pixel electrode are separated by a slit. The first pixel electrode has a V shape and the second pixel electrode is provided so as to surround the first pixel electrode.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulator functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that illustrated in FIG. 23B. For example, a switch, a resistor, a capacitor, a transistor, a sensor, a logic circuit, or the like may be added to the pixel circuit illustrated in FIG. 23B.

[Organic EL Display Device]

FIG. 23C shows another example of a circuit configuration of the pixel. Here, a pixel structure of a display device using an organic EL element is illustrated.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 23C shows an example of a pixel circuit. Here, one pixel includes two n-channel transistors. Note that any of the above-described transistors can be used as the n-channel transistors. Furthermore, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having a high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, a voltage higher than the voltage of the power supply line 5027 is applied to the gate electrode of the driver transistor 5022. Note that a voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that illustrated in FIG. 23C. For example, a switch, a resistor, a capacitor, a sensor, a transistor, a logic circuit, or the like may be added to the pixel circuit illustrated in FIG. 23C.

In the case where any of the above-described transistors is used for the circuit illustrated in FIGS. 23A to 23C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes, for example, at least one of an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, a MEMS shutter display element, an optical interference type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink, or an electrophoretic element include electronic paper. In the case of a transflective liquid crystal display or a reflective liquid crystal display, some of or all of pixel electrodes function as reflective electrodes. For example, some of or all of pixel electrodes are formed to contain aluminum, silver, or the like. In such a case, a memory circuit such as an SRAM can be provided under the reflective electrodes. Thus, power consumption can be further reduced.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced in some cases as compared to the case of using the coloring layer.

<Module>
A display module using a semiconductor device of one embodiment of the present invention is described below with reference to FIG. 24.

Figure 24:
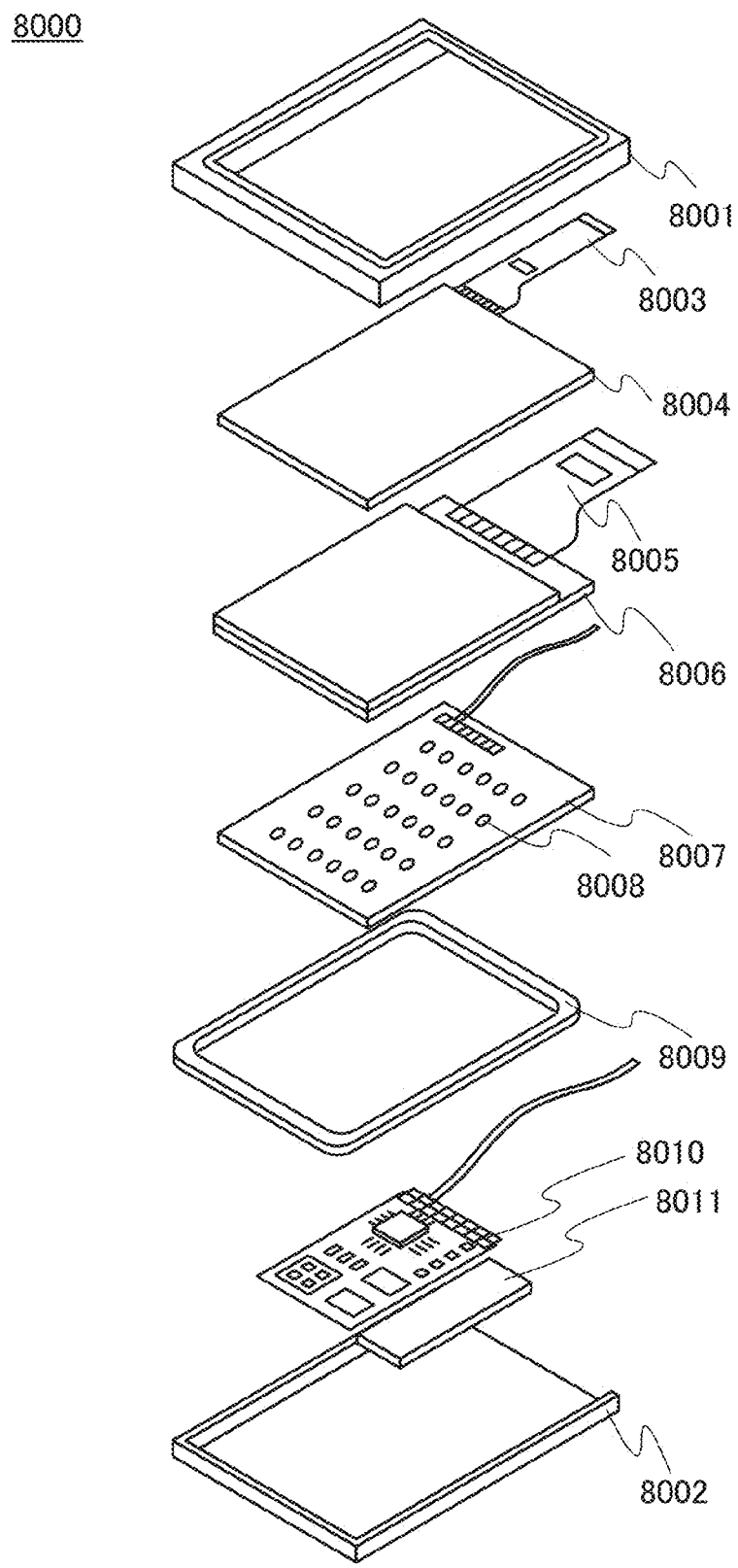
FIG. 24 illustrates a display module of one embodiment of the present invention.

In a display module 8000 in FIG. 24, a touch panel 8004 connected to an FPC 8003, a cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

<Electronic Device>
The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 25A to 25F illustrate specific examples of these electronic devices.

Figure 25A:
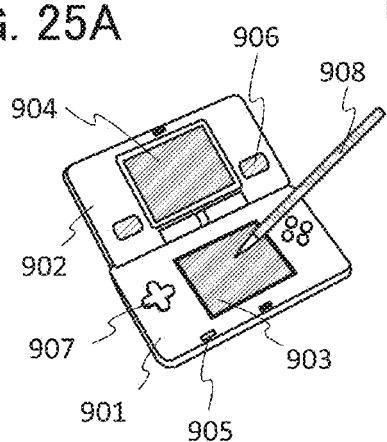
FIGS. 25A to 25F each illustrate an electronic device of one embodiment of the present invention.

FIG. 25A illustrates a portable game console including a housing 901, a housing 902, a display portion 903, a display portion 904, a microphone 905, a speaker 906, an operation key 907, a stylus 908, and the like. Although the portable game machine in FIG. 25A has the two display portions 903 and 904, the number of display portions included in a portable game machine is not limited to this.

Figure 25B:
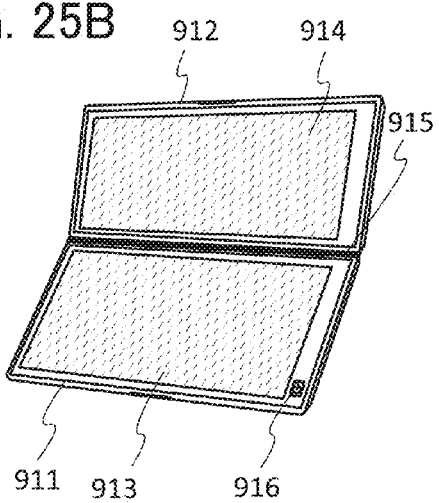

FIG. 25B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 25C:
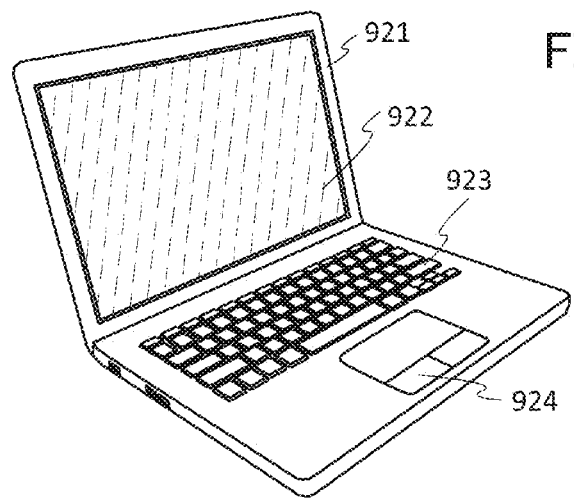

FIG. 25C illustrates a laptop personal computer including a housing 921, a display portion 922, a keyboard 923, a pointing device 924, and the like.

Figure 25D:
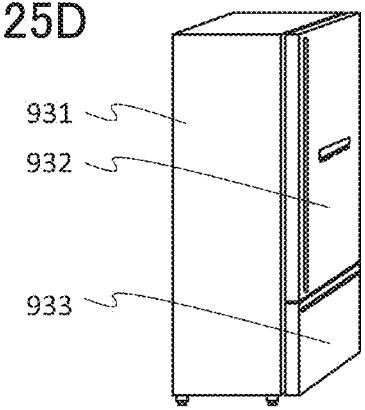

FIG. 25D illustrates an electric refrigerator-freezer including a housing 931, a door for a refrigerator 932, a door for a freezer 933, and the like.

Figure 25E:
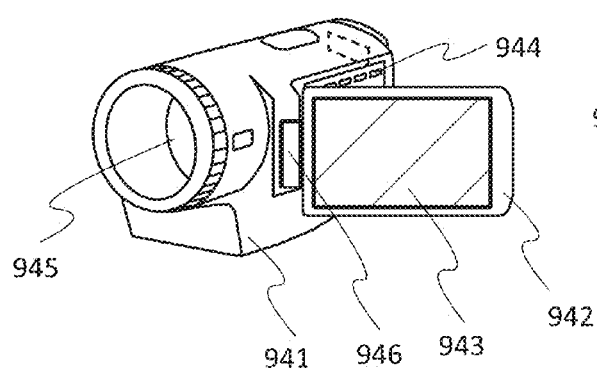

FIG. 25E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 25F:
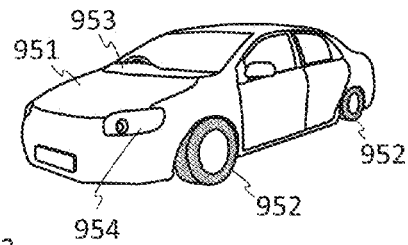

FIG. 25F illustrates an ordinary vehicle including a car body 951, wheels 952, a dashboard 953, lights 954, and the like.

<Electronic Device with Curved Display Region or Curved Light-Emitting Region>

Electronic devices with a curved display region or a curved light-emitting region, which are embodiments of the present invention, are described below with reference to FIGS. 26A1, 26A2, 26A3, 26B1, 26B2, 26C1, and 26C2. Here, information devices, in particular, portable information devices (portable devices) are described as examples of the electronic devices. The portable information devices include, for example, mobile phone devices (e.g., phablets and smartphones) and tablet terminals (slate PCs).

FIG. 26A1 is a perspective view illustrating an external shape of a portable device 1300A. FIG. 26A2 is a top view illustrating the portable device 1300A. FIG. 26A3 illustrates a usage state of the portable device 1300A.

FIGS. 26B1 and 26B2 are perspective views illustrating the outward form of a portable device 1300B.

FIGS. 26C1 and 26C2 are perspective views illustrating the outward form of a portable device 1300C.

<Portable Device>

The portable device 1300A has one or more functions of a telephone, email creating and reading, notebook, information browsing, and the like.

A display portion of the portable device 1300A is provided along plural surfaces. For example, the display portion may be provided by placing a flexible display device along the inside of a housing. Thus, text data, image data, or the like can be displayed on a first region 1311 and/or a second region 1312.

For example, images used for three operations can be displayed on the first region 1311 (see FIG. 26A1). Furthermore, text data and the like can be displayed on the second region 1312 as indicated by dashed rectangles in the drawing (see FIG. 26A2).

In the case where the second region 1312 is on the upper portion of the portable device 1300A, a user can easily see text data or image data displayed on the second region 1312 of the portable device 1300A while the portable device 1300A is placed in a breast pocket of the user's clothes (see FIG. 26A3). For example, the user can see the phone number, name, and the like of the caller of an incoming call, from above the portable device 1300A.

The portable device 1300A may include an input device or the like between the display device and the housing, in the display device, or over the housing. As the input device, for example, a touch sensor, a light sensor, or an ultrasonic sensor may be used. In the case where the input device is provided between the display device and the housing or over the housing, a touch panel may be, for example, a matrix switch type, a resistive type, an ultrasonic surface acoustic wave type, an infrared type, electromagnetic induction type, or an electrostatic capacitance type. In the case where the input device is provided in the display device, an in-cell sensor, an on-cell sensor, or the like may be used.

Note that the portable device 1300A can be provided with a vibration sensor or the like and a memory device that stores a program for shifting a mode into an incoming call rejection mode based on vibration sensed by the vibration sensor or the like. Thus, the user can shift the mode into the incoming call rejection mode by tapping the portable device 1300A over his/her clothes to apply vibration.

The portable device 1300B includes a display portion including the first region 1311 and the second region 1312 and a housing 1310 that supports the display portion.

The housing 1310 has a plurality of bend portions, and the longest bend portion in the housing 1310 is between the first region 1311 and the second region 1312.

The portable device 1300B can be used with the second region 1312 provided along the longest bend portion facing sideward.

The portable device 1300C includes a display portion including the first region 1311 and the second region 1312 and a housing 1310 that supports the display portion.

The housing 1310 has a plurality of bend portions, and the second longest bend portion in the housing 1310 is between the first region 1311 and the second region 1312.

The portable device 1300C can be used with the second region 1312 facing upward.

This application is based on Japanese Patent Application serial no. 2014-005618 filed with Japan Patent Office on Jan. 16, 2014, the entire contents of which are hereby incorporated by reference.

What is claimed is:

1. A semiconductor device comprising:
   a first insulator;
   a semiconductor over the first insulator, the semiconductor comprising a first region and a second region;
   a second insulator over the semiconductor;
   a first conductor over the second insulator, the first conductor comprising a first region overlapping the first region of the semiconductor and a second region not overlapping the first region of the semiconductor; and a second conductor comprising a region in contact with the second region of the semiconductor, wherein the first insulator comprises a protrusion region, wherein the semiconductor comprises a first layer over the protrusion region of the first insulator and a second layer over the first layer, wherein an electron affinity of the first layer is different from an electron affinity of the second layer, wherein a bottom surface of the second region of the first conductor is lower than a bottom surface of the second layer of the semiconductor, wherein a first side surface and a second side surface of the first region of the semiconductor face the first conductor, and wherein the first region of the first conductor and the region of the second conductor do not overlap each other.

2. The semiconductor device according to claim 1, further comprising a third insulator over the first conductor, wherein the semiconductor further comprises a third region between the first region and the second region, and wherein the third insulator is in contact with the third region of the semiconductor.

3. The semiconductor device according to claim 2, wherein the third insulator has a higher relative permittivity than the second insulator.

4. The semiconductor device according to claim 1, wherein the distance between the first region and the second region of the semiconductor is less than or equal to 30 nm.

5. The semiconductor device according to claim 1, wherein the semiconductor comprises indium and oxygen.

6. An electronic device comprising:
a display device;
a battery; and
the semiconductor device according to claim 1.

7. A semiconductor device comprising:
a first insulator;
a semiconductor over the first insulator, the semiconductor comprising a first region;
a second insulator over the semiconductor;
a first conductor over the second insulator, the first conductor comprising a first region overlapping the first region of the semiconductor and a second region not overlapping the first region of the semiconductor;
a second conductor comprising a region in contact with the semiconductor; and
a third conductor comprising a region in contact with the semiconductor, wherein the first insulator comprises a protrusion region, wherein the semiconductor comprises a first layer over the protrusion region of the first insulator and a second layer over the first layer, wherein an electron affinity of the first layer is different from an electron affinity of the second layer, wherein a bottom surface of the second region of the first conductor is lower than a bottom surface of the second layer of the semiconductor, wherein a first side surface and a second side surface of the first region of the semiconductor face the first conductor, and wherein the first region of the first conductor and the region of the second conductor do not overlap each other.

8. The semiconductor device according to claim 7, further comprising a third insulator over the first conductor, wherein the semiconductor further comprises a second region, and wherein the third insulator is in contact with the second region of the semiconductor.

9. The semiconductor device according to claim 8, wherein the third insulator has a higher relative permittivity than the second insulator.

10. The semiconductor device according to claim 8, wherein the semiconductor comprises indium and oxygen.

11. An electronic device comprising:
a display device;
a battery; and
the semiconductor device according to claim 7.

12. The semiconductor device according to claim 7, wherein the region of the first conductor and the region of the third conductor overlap each other.

13. A semiconductor device comprising:
a first insulator;
a first semiconductor over the first insulator, the first semiconductor comprising a first region and a second region;
a second semiconductor over the first semiconductor;
a second insulator over the second semiconductor;
a first conductor over the second insulator, the first conductor comprising a first region overlapping the first region of the first semiconductor and a second region not overlapping the first region of the first semiconductor; and
a second conductor comprising a region in contact with a top surface of the second region of the first semiconductor and a bottom surface of the second semiconductor, wherein the first insulator comprises a protrusion region, wherein the first semiconductor comprises a first layer over the protrusion region of the first insulator and a second layer over the first layer, wherein an electron affinity of the first layer is different from an electron affinity of the second layer, wherein a bottom surface of the second region of the first conductor is lower than a bottom surface of the second layer of the first semiconductor, wherein a first side surface and a second side surface of the first region of the first semiconductor face the first conductor, and wherein the first region of the first conductor and the region of the second conductor do not overlap each other.

14. The semiconductor device according to claim 13, further comprising a third insulator over the first conductor, wherein the first semiconductor further comprises a third region between the first region and the second region, wherein the second semiconductor comprises a region overlapping the third region of the first semiconductor, and wherein the third insulator is in contact with the region of the second semiconductor.

15. The semiconductor device according to claim 14, wherein the third insulator has a higher relative permittivity than the second insulator.

16. The semiconductor device according to claim 13, wherein the distance between the first region and the second region of the first semiconductor is less than or equal to 30 nm.

17. The semiconductor device according to claim 13, wherein an electron affinity of the second layer of the first semiconductor is different from an electron affinity of the second semiconductor.

18. The semiconductor device according to claim 13, wherein the first semiconductor comprises indium and oxygen.

19. An electronic device comprising:
a display device;
a battery; and the semiconductor device according to claim 13.

\* \* \* \* \*